United States Patent
Welch

(10) Patent No.: US 6,268,636 B1
(45) Date of Patent: *Jul. 31, 2001

(54) OPERATION AND BIASING FOR SINGLE DEVICE EQUIVALENT TO CMOS

(76) Inventor: James D. Welch, 10328 Pinehurst Ave., Omaha, NE (US) 68124

(*) Notice: Subject to any disclaimer, the term of this patent is extended or adjusted under 35 U.S.C. 154(b) by 0 days.

This patent is subject to a terminal disclaimer.

(21) Appl. No.: 09/246,871

(22) Filed: Feb. 8, 1999

Related U.S. Application Data

(63) Continuation-in-part of application No. 09/033,695, filed on Mar. 3, 1998, now Pat. No. 6,091,128, and a continuation-in-part of application No. 08/368,149, filed on Dec. 29, 1994, now Pat. No. 5,663,584, and a continuation-in-part of application No. 08/250,906, filed on May 31, 1994, now abandoned, and a continuation-in-part of application No. 08/578,336, filed on Dec. 26, 1995, now Pat. No. 5,760,449, which is a continuation-in-part of application No. 08/250,906, and application No. 08/368,149.

(60) Provisional application No. 06/059,270, filed on Sep. 18, 1997, provisional application No. 60/090,565, filed on Jun. 24, 1998, provisional application No. 60/090,085, filed on Jun. 20, 1998, and provisional application No. 60/081,705, filed on Apr. 15, 1998.

(51) Int. Cl.$^7$ .................. H01L 27/095; H01L 29/47; H01L 29/76; H01L 29/94; H01L 31/062
(52) U.S. Cl. .................. 257/476; 257/471; 257/484; 257/369; 257/401; 257/382; 257/384
(58) Field of Search ..................... 257/476, 471, 257/477, 483, 484, 369, 401, 382, 383, 384

(56) References Cited

U.S. PATENT DOCUMENTS

| | | | |
|---|---|---|---|
| 4,300,152 | 11/1981 | Lepselter | 357/42 |
| 4,485,550 | 12/1984 | Koeneke et al. | 29/571 |
| 4,696,093 | 9/1987 | Welch | 437/176 |
| 5,049,953 | 9/1991 | Mihara et al. | 357/15 |
| 5,177,568 | 1/1993 | Honma et al. | 257/295 |
| 5,229,323 | 7/1993 | Shimada et al. | 437/176 |
| 5,663,584 | 9/1997 | Welch | 257/288 |
| 5,760,449 | 6/1998 | Welch | 257/369 |
| 6,091,128 | * 7/2000 | Welch | 257/476 |

OTHER PUBLICATIONS

"Etched Schottky–Barrier M.O.S.F.E.T.S. using a Single Mask", Hegeboom & Cobbold; Elect. Letters, vol. 7, Nos. 5&6, (1971).

(List continued on next page.)

Primary Examiner—Steven Loke
(74) Attorney, Agent, or Firm—James D. Welch

(57) ABSTRACT

Disclosed are semiconductor devices including at least one junction which is rectifying whether the semiconductor is caused to be N or P-type, by the presence of field induced carriers. In particular, inverting and non-inverting gate voltage channel induced semiconductor single devices with operating characteristics similar to conventional multiple device CMOS systems, which can be operated as modulators, are disclosed as are a non-latching SCR and an approach to blocking parasitic currents. Operation of the gate voltage channel induced semiconductor single devices with operating characteristics similar to multiple device CMOS systems under typical bias schemes is described, and simple demonstrative five mask fabrication procedures for the inverting and non-inverting gate voltage channel induced semiconductor single devices with operating characteristics similar to multiple device CMOS systems are also presented.

17 Claims, 6 Drawing Sheets

OTHER PUBLICATIONS

"SB–IGFET: An Insulated–Gate Field–Effect Transistor using Schottky Barrier Contacts for Source and Drain"; Lepselter & Sze, Proc. of IEEE, (Aug. 1968).

"Some Properties of Chromium–Doped Silicon", Lebedev & Sultanov, Soviet–Physics, vol. 4, No. 11, (May 1971).

"Metallurgical and Electrical Properties of Chromium Silicon Interfaces", Solid State Physics, vol. 23, (1980).

"Compound Formation of Between Amorphous Silicon and Chromium", Yacobi et al, J. App. Phys., 51(12), (1980).

Formation Kenetics of $CrSi_2$ Films on Si Substrates with and without $PD2_Si$ Layer, J. Appl. Phys. vol. 47, No. 12 (1976).

* cited by examiner

ΔV' = PINCHOFF VOLTAGE DROP

ΔV'' = SILICON CHANNEL VOLTAGE DROP

ΔV = ΔV' + ΔV'' & IS "OFF" HALF SILICON CHANNEL CARRIER INDUCING GATE VOLTAGE

US 6,268,636 B1

OPERATION AND BIASING FOR SINGLE DEVICE EQUIVALENT TO CMOS

This application is a Continuation-In-Part of application Ser. No. 08/250,906 filed on May 31, 1994, (now abandoned), and of application Ser. No. 08/368,149 filed Dec. 29, 1994, (now U.S. Pat. No. 5,663,584), and of application Ser. No. 08/578,336, filed Dec. 26, 1995 (now U.S. Pat. No. 5,760,449), which is a Continuation-in-Part of said identified applications with Ser. Nos. 08/250,906 and 08/368,149. This application is a Continuation-In-Part of Application Ser. No. 60/059,270 filed on Sep. 18, 1997. This application also relies on Disclosure Document No. 402672, filed Jul. 18, 1996. This application also Claims priority from Disclosure Document 433236 and CIP Utility patent application Ser. No. 09/033,695 filed Mar. 3, 1998, now U.S. Pat. No. 6,091,128, which has priority from said Ser. Nos. 08/250,906, 08/368,149 and 08/578,336 applications and from Provisional Patent Application Ser. No. 60/081,705 which was filed Apr. 15, 1998, and from Provisional Application Serial No. 60/090,085 filed Jun. 20, 1998; and from Provisional Patent Application Serial No. 60/090,565 filed Jun. 24, 1998.

The invention in this application was conceived and developed in part under support provided by a grant from the Energy Related Inventions Program of the United States Federal Department of Energy, Contract No. DE-FG47-93R701314. The United States Government has certain rights in this invention.

TECHNICAL AREA

The present invention relates to semiconductor devices, and more particularly comprises semiconductor devices which include junctions that rectify when the semiconductor is doped either N or P-type, by either metalurgical or field induced means. A preferred embodiment is formed in intrinsic semiconductor and is a simple to fabricate single device which operates similarly to conventional dual device CMOS, under described biasing schemes.

BACKGROUND

MOSFETS, CMOS, gate voltage controlled direction of rectification, and single device inverting and single device non-inverting MOS semiconductor devices which demonstrate operating characteristics similar to those of multiple device Complimentary Metal Oxide Semiconductor (CMOS) systems have been previously described in U.S. Pat. No. 5,663,584 to Welch, and said 584 patent is incorporated hereinto by reference. Semiconductor devices described in said 584 patent operate on the basis that materials exist which produce a rectifying junction with semiconductor channel regions when they are doped either N or P-type, whether said doping is achieved via metalurgical or field induced means. Said materials typically form junctions that are termed "Schottky barrier" junctions with semiconductors, (in contrast to P-N Junction), however, said terminology is not to be considered limiting to the present invention based upon technical definitions of the terminology "Schottky barrier", and where the terminology "Schottky barrier" junction is utilized in this Disclosure it is to be understood that it is used primarily to distinguish a junction described thereby from "P-N" junctions, and to identify junctions between a semiconductor and an element which are rectifying whether N or P-type Doping is present in the semiconductor, and whether said doping is present as the result of metalurgical or field induced means.

Another patent, U.S. Pat. No. 5,760,449 to Welch describes Source Coupled Regeneratively Switching CMOS formed from a seriesed combination of N and P-Channel MOSFTES which each demonstrate the special operating characteristics of conducting significant current flow only when the Drain and Gate of a 449 patent MOSFET are of opposite polarity, and the Gate polarity is appropriate to invert a channel region. Said 449 patent is incorporated hereinto by reference, as are co-pending application Ser. Nos. 09/033,695 and 60/081,705 and 60/090,565. Also disclosed are patents to Lepselter, U.S. Pat. No. 4,300,152; Koeneke et al., U.S. Pat. No. 4,485,550; Welch, U.S. Pat. No. 4,696,093; Mihara et al., U.S. Pat. No. 5,049,953 and Homna et al. U.S. Pat. No. 5,177,568. A relevant article titled "SB-IGFET: An Insulated Gate Field Effect Transistor using Schottky Barrier Contacts for Source and Drain", by Lepselter & Sze, Proc. IEEE, 56, January 1968, pp. 1400–1402, is also identified in said 584 patent. Further, a a paper by Lebedov & Sultanov, titled "Some Properties of Chromin-Doped Silicon", Soviet Physics, Vol. 4, No. 11, May 1971 is identified as it discusses formation of a rectifying junction by diffusion of chromium into P-type Silicon. A paper by Hogeboom & Cobbold, titled "Etched Schottky Barrier MOSFETS Using A Single Mask, Electronics Letters, Vol. 7, No. 5/6, (March 1971) is also included as it describes formation of Schottky barrier MOSFETS by deposition of Aluminum onto semiconductor. Also mentioned, and included herein by reference for general insight to semiconductor circuits and systems, is a book titled "Microelectronic Circuits" by Sedra and Smith, Saunders College Publishing, 1991. Likewise mentioned, and included herein by reference for the purpose of providing insight into semiconductor device fabrication, is a book titled "Physics and Technology of Semiconductor Devices", by Grove, John Wiley & Sons, 1967; and a book titled "Electronic Materials Science: For Integrated Circuits in Si and GaAs", Mayer & Lau, MacMillan, 1990.

Even in view of the cited Welch U.S. Pat. Nos. 5,663,584 and 5,760,449 patents, and co-pending CIP applications derived therefrom which describe inverting and non-inverting single device equivalents to conventional CMOS, regeneratively switching N and P-Channel source coupled CMOS, and the blocking of parasitic current flows in semiconductor systems by use of material which forms rectifying junctions with either N or P-type semiconductor whether said doping is metallurgically or field induced; there remains need for clarification and description of biasing and switching operational characteristics of single device equivalents to CMOS, particularly where essentially intrinsic, or lightly doped, semiconductor is beneficially utilized as device isolating semiconductor substrate material.

DISCLOSURE OF THE INVENTION

The present invention is primarily a semiconductor device in a semiconductor substrate, comprising at least one junction which is formed by introduction of non-semiconductor substrate material(s) to said semiconductor substrate, wherein said non-semiconductor substrate material(s) form a rectifying junction with either N and P-type semiconductor, whether said doping is metallurgically or field induced. Said non-semiconductor components can be material(s) or dopants entered to a semiconductor substrate by, for instance, a procedure comprising vacuum deposition, ion-implantation and/or pre-deposition and diffusion, each where appropriate accompanied by annealing. And, it is noted that the semiconductor substrate can, prior to the fabrication of present invention semiconductor devices therein, be initially intrinsic or doped.

Most importantly, the present invention comprises inverting and non-inverting devices with operating characteristics similar to dual device seriesed N and P-Channel MOSFETS CMOS systems. In use said inverting and non-inverting present invention devices, comprise two oppositely facing electrically interconnected rectifying diodes in intrinsic, or a single doping type semiconductor. A basic feature of present invention devices is that a forward direction of rectification of each of said electrically interconnected oppositely facing rectifying diodes changes depending upon what doping type, (N or P), be it metallurgically or field induced, is present in the semiconductor. Said present invention inverting and non-inverting single device equivalents to dual device seriesed N and P-Channel MOSFETS CMOS systems further comprise gate means for field inducing effective doping type in said semiconductor, said gate means being set off from said semiconductor by insulator, and each has a non-electrically interconnected terminal. In use, different voltages are applied to the non-electrically interconnected terminals of each of the oppositely facing rectifying diodes, and a voltage between said applied different voltages, inclusive, is monitored at the electrical interconnection between said two oppositely facing rectifying diodes, which monitored voltage responds as a function of applied gate voltage. Said monitored voltage is essentially electrically isolated from said gate voltage and appears at said electrical interconnection between said two oppositely facing rectifying diodes primarily through the rectifying diode selected from the group consisting of: (both of said two oppositely facing electrically interconnected rectifying diodes), which is caused to be forward biased as a result of semiconductor "doping type" modulation by said applied gate voltage. The basis of operation of said inverting and non-inverting gate voltage channel induced semiconductor devices being that said rectifying junctions are each comprised of material(s) that form a rectifying junction to semiconductor when it is doped either N or P-type by either metalurgical or field induced means.

To aide with understanding of the present invention, an embodiment of an inverting gate voltage channel induced semiconductor device with operating characteristics similar to multiple device Complimentary Metal Oxide Semiconductor (CMOS) systems, similar to that disclosed in U.S. Pat. No. 5,663,584 and continuations therefrom, is described directly herein. Said inverting gate voltage channel induced semiconductor device is typically, though not necessarily, formed in a surface region of a single doping type semiconductor and comprises two junctions, termed source and drain, which are separated by a first semiconductor channel region, and further comprises two additional junctions, termed source and drain, which are separated by a second semiconductor channel region. Gates, to which semiconductor channel region effecting voltage can be applied, are associated with each of the first and second semiconductor channel regions, said gates being offset from said first and second semiconductor channel regions by insulating material. During use, application a sufficient positive voltage to said gates will attract electrons to said first and second semiconductor channel regions, and application of sufficient negative voltage to said gates will attract holes to said first and second semiconductor channel regions, the purpose of applying such gate voltage being to modulate the effective doping type of said first and second semiconductor channel regions between respective source and drain junctions, which source junctions are each essentially non-rectifying, and which drain junctions are rectifying junctions. Said rectifying junctions can each be a Schottky barrier junction comprising a semiconductor and non-semiconductor component. However, any junction which performs the function required, (ie. the formed junction is rectifying when either N or P-type doping is present in the semiconductor, whether metallurgical or field induced), is within the scope of the present invention. And, it is specifically to be understood that such junctions can be formed by ion implantation, or diffusion procedures as reported by Lebedev and Sultanov in the reference thereby cited in the Background Section herein, which reference disclosed diffusion chromium into P-type Silicon and thereby formed rectifying junctions. (It is to be understood, that where ion implantation or diffusion etc. techniques are applied to place junction forming material(s) into a semiconductor, the resulting junctions can still be described as being Schottky barriers, perhaps not in the standard sense of being a metal directly bonded to a semiconductor, but in the sense that a material forms a rectifying junction—other than a P-N junction—in said semiconductor. Also, even where a metal is deposited onto a semiconductor, and annealing is applied to the resulting system, some diffusion of the deposited metal per se. can occur into the semiconductor or a compound can form which extends into the semiconductor, leaving the boundary between what is purely a Schottky barrier and what involves a diffusion formed junction a bit "grey").

Continuing, in the directly following, for purposes of description, said rectifying junctions are assumed to be Schottky barrier junctions comprising semiconductor and non-semiconductor components, and a non-semiconductor component of the rectifying Schottky barrier drain junction associated with said first semiconductor channel region of said inverting gate voltage channel induced semiconductor device with operating characteristics similar to multiple device Complimentary Metal Oxide Semiconductor (CMOS) systems, is electrically interconnected with a non-semiconductor component of the rectifying Schottky barrier drain junction associated with said second semiconductor channel region, and said gates associated with the first and second channel regions are electrically interconnected. During operation the electrically non-interconnected essentially non-rectifying source junctions are held at different voltages, and application of a gate voltage controls effective semiconductor channel region doping type in both said first and second channel regions, and thus which electrically interconnected rectifying Schottky barrier drain junction forward conducts and which does not forward conduct, thereby controlling the voltage present at the non-semiconductor components of the electrically interconnected Schottky barrier drain junctions essentially through said forward conducting rectifying semiconductor Schottky barrier junction. In said inverting gate voltage channel induced semiconductor device an increase in applied Gate voltage leads to a decrease in the voltage present at the non-semiconductor components of the electrically interconnected Schottky barrier drain junctions, which can be accessed via a junction thereto. It is to be noted that said non-semiconductor components of said Schottky barrier drain junctions are present "between" said first and second channel regions, as said term "between" is utilized herein, (ie. electrically between). (Note, special discussion of operational bias characteristics of inverting gate voltage channel induced semiconductor device with operating characteristics similar to multiple device Complimentary Metal Oxide Semiconductor (CMOS) systems, particularly when formed in intrinsic semiconductor, (and where a constant polarity voltage source is applied across the electrically non-interconnected essentially ohmic junctions is utilized), is found in the Detailed Description of this Disclosure).

Particularly where an inverting gate voltage channel induced semiconductor device with operating characteristics similar to multiple device Complimentary Metal Oxide Semiconductor (CMOS) systems is formed in essentially intrinsic semiconductor, the operational description is beneficially slightly revised. Said inverting gate voltage channel induced semiconductor device formed an intrinsic semiconductor substrate still comprises two junctions, termed source and drain, which are separated by a first semiconductor channel region, and still further comprises two additional junctions, termed source and drain, which are separated by a second semiconductor channel region. Gates, to which semiconductor channel region effecting voltage can be applied, are still associated with each of the first and second semiconductor channel regions, said gates being offset from said first and second semiconductor channel regions by insulating material. During use application of sufficient positive voltage to said gates still attracts electrons to said first and second semiconductor channel regions, and application of sufficient negative voltage to said gates still attracts holes to said first and second semiconductor channel regions, the purpose of applying such gate voltage being to modulate the effective doping type of said first and second semiconductor channel regions between respective source and drain junctions. However, the source junctions are each essentially non-rectifying only when sufficient gate voltage induced doping is present in the channel region adjacent thereto, and the drain junctions are rectifying (Schottky barrier) junctions only when sufficient gate voltage induced doping is caused to be present in the channel region adjacent thereto. Again assuming said "potentially" rectifying junctions are Schottky barrier junctions and each comprises semiconductor and non-semiconductor components, a non-semiconductor component of the "potentially" rectifying (Schottky barrier) drain junction associated with said first semiconductor channel region is again electrically interconnected with a non-semiconductor component of the "potentially" rectifying (Schottky barrier) drain junction associated with said second semiconductor channel region, and said gates are again electrically interconnected. During operation the electrically non-interconnected "potentially" essentially non-rectifying source junctions are held at different, preferably same polarity, voltages. Said voltages can be selected from the group consisting of: (positive and negative with respect to ground inclusive of ground). Application of a gate voltage selected from the group consisting of: (positive and negative), controls effective semiconductor channel region doping type in said first and second channel regions to be a selection from the group consisting of: (essentially non-conductive intrinsic and doped to the same type selected from the group consisting of: (n-type and p-type), at doping levels selected from the group consisting of: (essentially equal and different in said first and second channels)). Thus is determined which electrically interconnected rectifying (Schottky barrier) drain junction forms in said otherwise intrinsic semiconductor substrate and forward conducts, thereby controlling the voltage present at the non-semiconductor components of the electrically interconnected (Schottky barrier) drain junctions essentially through said formed forward conducting rectifying semiconductor (Schottky barrier) junction. The basis of operation is that intrinsic semiconductor is essentially non-conductive but that said (Schottky barrier) junctions associated with said first and second semiconductor channel regions are comprised of material(s) that form a rectifying junction to a semiconductor channel region when it is caused to be doped either N or P-type by field induced means. It is to be understood that the semiconductor substrate channel region and adjacent (Schottky barrier) junction which is not forward conducting can be characterized as a selection from the group consisting of: (being an essentially intrinsic channel region; being functionally comprised of two regions across which voltage can drop, namely an onset of pinch-off region and an essentially intrinsic channel region; and being functionally comprised of three regions across which voltage can drop, namely an onset of pinch-off region, a portion of the channel region which is populated with some gate voltage induced carriers, and a reverse biased (Schottky barrier) junction). Additionally, the semiconductor substrate channel region and adjacent (Schottky barrier) junction which is forward conducting can be characterized as comprising a doped channel region and a forward biased (Schottky barrier) junction.

Of course operation of inverting gate voltage channel induced semiconductor devices with operating characteristics similar to multiple device Complimentary Metal Oxide Semiconductor (CMOS) systems formed in a lightly doped single doping type semiconductor is essentially similarly described, or finds description inherent in a combination of said foregoing descriptions of single device equivalent to CMOS formed in doped and in essentially intrinsic semiconductor.

A non-inverting gate voltage channel induced semiconductor device with operating characteristics similar to multiple device Complimentary Metal Oxide Semiconductor (CMOS) systems is formed in a single doping type semiconductor and comprises two junctions, termed source and drain, which are separated by a first semiconductor channel region, and further comprises two additional junctions, termed source and drain, which are separated by a second semiconductor channel region. Gates to which semiconductor channel region effecting voltage can be applied are associated with each of the first and second semiconductor channel regions, said gates being offset from said first and second semiconductor channel regions by insulating material. During use, application a sufficient positive voltage to said gates will attract electrons to said first and second semiconductor channel regions, and application of sufficient negative voltage to said gates will attract holes to said first and second semiconductor channel regions, the purpose of applying such gate voltage being to modulate the effective doping type of said first and second semiconductor channel regions between respective source and drain junctions, which source junctions are each essentially non-rectifying, and which drain junctions are rectifying (Schottky barrier) junctions. Again, for purposes of discussion, assuming the rectifying junctions are Schottky barrier junctions which each comprise a semiconductor and non-semiconductor component, in the non-inverting gate voltage channel induced semiconductor device the non-rectifying source junction associated with said first channel region and the non-rectifying source junction associated with the second channel region are electrically interconnected, and said gates associated with the first and second channel regions are electrically interconnected. During operation non-semiconductor components of electrically non-interconnected rectifying (Schottky barrier) source junctions are held at different voltages, and application of a gate voltage controls effective semiconductor channel region doping type in both said first and second channel regions, and thus which electrically non-interconnected rectifying (Schottky barrier) source junction forward conducts and which does not forward conduct, thereby controlling the voltage present at the electrically interconnected essentially non-rectifying source junctions through said forward conducting rectifying (Schottky barrier) junction. In said non-inverting gate voltage channel induced semiconductor device an increase in applied Gate voltage leads to an increase in the voltage appearing at the electrically interconnected essentially non-rectifying source junctions. It is to be noted that said essentially non-rectifying source junctions are present "between" said first and second channel regions, as said term "between" is utilized herein.

Where Intrinsic semiconductor is utilized, the description is beneficially slightly revised. Said non-inverting gate voltage channel induced semiconductor device with operating characteristics similar to multiple device Complimentary Metal Oxide Semiconductor (CMOS) systems formed in a essentially intrinsic semiconductor substrate still comprises two junctions, termed source and drain, which are separated by a first semiconductor channel region, and still further comprises two additional junctions, termed source and drain, which are separated by a second semiconductor channel region. Gates to which semiconductor channel region effecting voltage can be applied are still associated with each of the first and second semiconductor channel regions, said gates being offset from said first and second semiconductor channel regions by insulating material. During use, application of sufficient positive voltage to said gates still attracts electrons to said first and second semiconductor channel regions, and application of sufficient negative voltage to said gates still attracts holes to said first and second semiconductor channel regions, the purpose of applying such gate voltage being to modulate the effective doping type of said first and second semiconductor channel regions between respective source and drain junctions, which source junctions are each potentially essentially non-rectifying when sufficient field-induced doping is attracted into said first and second channel regions, and which drain junctions are potentially rectifying (Schottky barrier) junctions when sufficient field-induced doping is attracted into said first and second channel regions. Again assuming said potentially rectifying junctions are Schottky barrier junctions which each comprise a semiconductor and non-semiconductor component, in the non-inverting gate voltage channel induced semiconductor device the potentially non-rectifying source junction associated with said first channel region and the potentially non-rectifying source junction associated with the second channel region are electrically interconnected, and said gates associated with the first and second channel regions are electrically interconnected. During operation non-semiconductor components of electrically non-interconnected potentially rectifying (Schottky barrier) drain junctions are held at different voltages, and application of a gate voltage controls effective semiconductor channel region doping type in both said first and second channel regions, and thus which electrically non-interconnected rectifying (Schottky barrier) source junction forms and forward conducts and which does not, thereby controlling the voltage present at the formed electrically interconnected essentially non-rectifying source junctions, through said forward conducting rectifying (Schottky barrier) junction. In said non-inverting gate voltage channel induced semiconductor device an increase in applied Gate voltage leads to an increase in the voltage appearing at the electrically interconnected essentially non-rectifying source junctions which form. It is to be noted that said essentially non-rectifying source junctions are present "between" said first and second channel regions, as said term "between" is utilized herein.

The basis of operation of both said inverting and non-inverting gate voltage channel induced semiconductor devices is that said (Schottky barrier) junctions are formed from said first and second semiconductor channel regions and material(s) which provide a rectifying junction to a semiconductor channel region when it is doped wither N or P-type, whether said doping is achieved via metalurgical or field induced means.

In both said inverting and non-inverting gate voltage channel induced semiconductor devices the electrically interconnected drain, or electrically interconnected source, junctions comprise an essentially electrically isolated, (from said gates), terminal, and said electrical interconnection between sources, (non-inverting case), or drains, (inverting case), can be considered to be electrically interconnected to a separate or essentially integrated thereinto essentially electrically isolated terminal. In particular said "essentially electrically isolated terminal" can be an integral indistinguishable unit with an electrical interconnection between non-semiconductor components of a Schottky barrier junction which are present outside of, (ie. "between"), first and second channel regions in an inverting single device with operating characteristics similar to multiple device (CMOS) systems, or similarly, with ohmic junctions between first and second channel regions. Such an "essentially electrically isolated terminal" can also be considered to contact said electrically interconnected sources or drains by a "junction" thereto. The concept of an essentially electrically isolated terminal is identified as it provides analogy to conventional (CMOS), but as in conventional (CMOS) its discrete presence is not pivotal. Also, it is specifically noted that the word "between" does not imply a physical, geometrical direct placement of a junction or other contact, but rather refers more to an electrical continuity with junction components "outside" of both channel regions per se. For instance, a junction placed to the right or left or top or bottom of first and/or second channel regions which are located vertically one above the other, is still "between" said first and second channel regions, as it is not within said first or second channel regions. Said otherwise, any geometrical location of any channel regions, contact(s) or junction(s) etc., consistent with described functional operation of single device equivalents to multiple device (CMOS) is to be considered within the scope of Claimed invention, emphasis added.

Continuing, an alternative description of an inverting gate voltage channel induced semiconductor device with operating characteristics similar to multiple device Complimentary Metal Oxide Semiconductor (CMOS) systems, provides that said inverting gate voltage channel induced semiconductor device be formed in a single doping type semiconductor and comprise two junctions, termed source and drain, which are separated by a first semiconductor channel region, and further comprise two additional junctions, termed source and drain, which are separated by a second semiconductor channel region. Gates, to which semiconductor channel region doping effecting voltage can be applied, are associated with each of the first and second semiconductor channel regions, said gates being offset from said first and second semiconductor channel regions by insulating material. During use application a sufficient positive voltage to said gates will attract electrons to said first and second semiconductor channel regions, and such that application of sufficient negative voltage to said gates will attract holes to said first and second semiconductor channel regions, the purpose of applying such gate voltage being to modulate the effective doping type of said first and second semiconductor channel regions between respective source and drain junctions, which source junctions are each essentially non-rectifying, and which drain junctions are rectifying junctions. In said inverting gate voltage channel induced semiconductor device the rectifying drain junction associated with said first semiconductor channel region is electrically interconnected with the rectifying drain junction associated with said second semiconductor channel regions, and said gates associated with said first and second channel regions are electrically interconnected. During operation the electrically non-interconnected essentially non-rectifying source junctions are held at different voltages, and application of a gate voltage controls effective semiconductor channel region doping type in both said first and second channel regions, and thus which electrically interconnected rectifying drain junction forward conducts and which does not forward conduct, thereby controlling the voltage present at the electrically interconnected rectifying drain junctions essentially through said forward conducting rectifying drain junction. The basis of operation of said inverting gate voltage channel induced semiconductor device is that said rectifying drain junctions associated with said first and second semiconductor channel regions thereof are comprised of material(s) that form a rectifying junction to a semiconductor channel region when it is doped either N or P-type by either metalurgical or field induced means.

An alternative description of a non-inverting gate voltage channel induced semiconductor device with operating characteristics similar to multiple device Complimentary Metal Oxide Semiconductor (CMOS) systems, provides that said non-inverting gate voltage channel induced semiconductor device is formed in a single doping type semiconductor and comprises two junctions, termed source and drain, which are separated by a first semiconductor channel region, and further comprises two additional junctions, termed source and drain, which are separated by a second semiconductor channel region, wherein gates, to which semiconductor channel region doping effecting voltage can be applied, are associated with each of the first and second semiconductor channel regions, said gates being offset from said first and second semiconductor channel regions by insulating material. During use application a sufficient positive voltage to said gates will attract electrons to said first and second semiconductor channel regions, and application of sufficient negative voltage to said gates will attract holes to said first and second semiconductor channel regions, the purpose of applying such gate voltage being to modulate the effective doping type of said first and second semiconductor channel regions between respective source and drain junctions, which source junctions are each essentially non-rectifying, and which drain junctions are rectifying junctions. The essentially non-rectifying source junction associated with said first channel region and the essentially non-rectifying source junction associated with the second channel region are electrically interconnected, and said gates associated with said first and second channel regions are electrically interconnected. During operation the electrically non-interconnected rectifying drain junctions are held at different voltages, and application of a gate voltage controls effective semiconductor channel region doping type in both said first and second channel regions, and thus which electrically non-interconnected rectifying drain junction forward conducts and which does not forward conduct, thereby controlling the voltage present at the electrically interconnected essentially non-rectifying source junctions through said forward conducting rectifying drain junction. The basis of operation of said non-inverting gate voltage channel induced semiconductor devices being that said rectifying drain junctions associated with said first and second semiconductor channel regions thereof are comprised of material(s) that form a rectifying junction to a semiconductor channel region when it is doped either N or P-type by either metalurgical or field induced means.

As another alternative description of a non-inverting gate voltage channel induced semiconductor device with operating characteristics similar to multiple device Complimentary Metal Oxide Semiconductor (CMOS) systems, said non-inverting gate voltage channel induced semiconductor device is formed in a single doping type semiconductor and comprises tow junctions, termed source and drain, which are separated by a semiconductor channel region, wherein a gate, to which semiconductor channel region doping effecting voltage can be applied, is associated with said semiconductor channel region, said gate being offset from said semiconductor channel region by insulating material. During use application a sufficient positive voltage to said gate will attract electrons to said semiconductor channel region, and application of sufficient negative voltage to said gate will attract holes to said semiconductor channel region, the purpose of applying such gate voltage being to modulate the effective doping type of said semiconductor channel region between said source and drain junctions, which source and drain junctions are both rectifying junctions. Said non-inverting gate voltage channel induced semiconductor device with operating characteristics similar to multiple device Complimentary Metal Oxide Semiconductor (CMOS) systems further comprises an electrical contact to said channel region. During operation the rectifying source and drain junctions are held at different voltages, and application of a gate voltage controls effective semiconductor channel region doping type in said channel region, and thus which rectifying junction forward conducts and which does not forward conduct, thereby controlling the voltage present at the electrical contact to said channel region essentially through said forward conducting rectifying junction. Again, the basis of operation of said non-inverting gate voltage channel induced semiconductor device being that said rectifying junctions associated with a semiconductor channel region are comprises of material(s) that form a rectifying junction to semiconductor channel region when it is doped either N or P-type by either metalurgical or field induced means.

Another description of the present invention inverting and non-inverting devices with operating characteristics similar to dual device seriesed N or P-Channel MOSFETS CMOS systems provides that in use, two oppositely facing electrically interconnected rectifying diodes in intrinsic, or a single doping type semiconductor are formed, each of said electrically interconnected rectifying diodes having an accessible terminal. A forward direction of rectification of each of said electrically interconnected rectifying diodes changes depending upon what doping type, (N or P), be it metallurgically or field induced, is present in the semiconductor, said inverting and non-inverting single device equivalents to dual device seriesed N or P-Channel MOSFETS CMOS systems further comprises gate means for field inducing effective doping type in said semiconductor, said gate means being set off from said semiconductor by insulator; wherein, in use, different voltages are applied to each accessible terminal of each of the oppositely facing rectifying diodes, and a voltage between said applied different voltages, inclusive, is monitored at the electrical interconnection between said two oppositely facing rectifying diodes, which monitored voltage responds as a function of applied gate voltage, said monitored voltage being essentially electrically isolated from said gate voltage and appearing at said electrical interconnection between said two oppositely facing rectifying diodes primarily through the rectifying diode selected from the group consisting of: (said two oppositely facing electrically interconnected rectifying diodes), which is caused to be forward biased as a result of semiconductor doping type modulation by said applied gate voltage.

A present invention semiconductor device with operating characteristics similar to multiple device Complimentary Metal Oxide Semiconductor (CMOS) systems can also be described as being formed in a semiconductor substrate and comprising at least one rectifying junction which is formed from non-semiconductor substrate and semiconductor substrate components, wherein said junction non-semiconductor substrate component is comprised of material(s) which, in use, form a rectifying junction with either N and P-type semiconductor, whether metallurgically or field induced.

Another description of a present invention inverting gate voltage channel induced semiconductor device with operating characteristics similar to multiple device Complimentary Metal Oxide Semiconductor (CMOS) systems, provides that said inverting gate voltage channel induced semiconductor device be formed in an intrinsic or single doping-type semiconductor substrate and comprises two junctions, termed source and drain, which are separated by a first semiconductor channel region, and further comprises two additional junctions, termed source and drain, which are separated by a second semiconductor channel region. Gates, to which semiconductor channel region effecting voltage can be applied, are associated with each of the first and second semiconductor channel regions, said gates being offset from said first and second semiconductor channel regions by insulating material. During use application a sufficient positive voltage to said gates will attract electrons to said first and second semiconductor channel regions, and such that application of sufficient negative voltage to said gates will attract holes to said first and second semiconductor channel regions, the purpose of applying such gate voltage being to modulate the effective doping type of said first and second semiconductor channel regions between respective source and drain junctions, which source junctions are each essentially non-rectifying when sufficient gate voltage induced doping is present in the channel region adjacent thereto, and which drain junctions are rectifying junctions when sufficient gate voltage induced doping is caused to be present in the channel region adjacent thereto. A rectifying drain junction with said first semiconductor channel region is electrically interconnected with a rectifying drain junction associated with said second semiconductor channel region, and in which said gates are electrically interconnected. During operation the electrically non-interconnected essentially non-rectifying source junctions are held at different voltages, and application of a gate voltage selected from the group consisting of: (positive and negative), controls effective semiconductor channel region doping type in said first and second channel regions to be a selection from the group consisting of: (essentially non-conductive intrinsic and doped to the same type selected from the group consisting of: (N-type and P-type), at doping levels selected from the group consisting of: (essentially equal and different)); and thus which electrically interconnected rectifying drain junction in said single doping type semiconductor substrate forms and forward conducts, thereby controlling the voltage present at the electrically interconnected rectifying drain junctions essentially through said formed forward conducting rectifying drain junction. The basis of operation is that said rectifying junctions associated with said first and second semiconductor channel regions are comprised of materials that form a rectifying junction to a semiconductor channel region when it is caused to be doped either N or P-type by either metallurgical or field induced means.

It is further noted that the described semiconductor substrate channel region and junction which is not forward conducting is characterized by at least one selection from the group consisting of:

a. being an essentially intrinsic channel region;
b. being functionally comprised of two regions across which voltage can drop, namely an onset of pinch-off region and an essentially intrinsic channel region;
c. being functionally comprised of three regions across which voltage can drop, namely an onset of pinch-off region, a portion of the channel region which is populated with some gate voltage induced carries, and a reverse biased rectifying junction.

Also, the inverting gate voltage channel induced semiconductor device semiconductor substrate channel region and adjacent junction which is forward conducting is characterized as comprising a doped channel region and a forward biased junction.

Another description of a present invention non-inverting gate voltage channel induced semiconductor device with operating characteristics similar to multiple device Complimentary Metal Oxide Semiconductor (CMOS) systems, said non-inverting gate voltage channel induced semiconductor device being formed in an intrinsic or single doping-type semiconductor substrate and comprising two junctions, termed source and drain, which are separated by a first semiconductor channel region, and further comprising two additional junctions, termed source and drain, which are separated by a second semiconductor channel region. Gates, to which semiconductor channel region effecting voltage can be applied, are associated with each of the first and second semiconductor channel regions, said gates being offset from said first and second semiconductor channel regions by insulating material. During use application a sufficient positive voltage to said gates will attract electrons to said first and second semiconductor channel regions, and application of sufficient negative voltage to said gates will attract holes to said first and second semiconductor channel regions, the purpose of applying such gate voltage being to modulate the effective doping type of said first and second semiconductor channel regions between respective source and drain junctions, which source junctions are each essentially non-rectifying when sufficient gate voltage induced doping is present in the channel region adjacent thereto, and which drain junctions are rectifying junctions when sufficient gate voltage induced doping is caused to be present in the channel region adjacent thereto. In said non-inverting gate voltage channel induced semiconductor device the potentially essentially ohmic source junction associated with said first semiconductor channel region is electrically interconnected with a the potentially ohmic source junction associated with said second semiconductor channel region, and in which said gates are electrically interconnected. During operation the electrically non-interconnected potentially rectifying drain junctions are held at different voltages, and application of a gate voltage selected from the group consisting of: (positive and negative), controls effective semiconductor channel region doping type in said first and second channel regions to be a selection from the group consisting of: (essentially non-conductive intrinsic and doped to the same type selected from the group consisting of: (n-type and p-type), at doping levels selected from the group consisting of: (essentially equal and different)); and thus controls formation of a forward conducting rectifying drain junction in said semiconductor substrate, thereby controlling the voltage present at the electrically interconnected potentially ohmic source junction essentially through said formed forward conducting rectifying junction. The basis of operation being that intrinsic semiconductor is essentially non-conductive but that said rectifying junctions associated with said first and second semiconductor channel regions are comprised of material(s) that form a rectifying junction to a semiconductor channel region when it is caused to be doped either N or P-type by field induced means.

The semiconductor substrate channel region and adjacent rectifying junction which is not forward conducting is characterized by at least one selection from the group consisting of:

a. being an essentially intrinsic channel region;
   b. being functionally comprised of two regions across which voltage can drop, namely a portion of the channel region which is populated with some gate voltage induced carriers, and a reverse biased rectifying junction.

The semiconductor substrate channel region and adjacent rectifying junction which is forward conducting is characterized as comprising a field induced doped channel region and a forward biased rectifying junction.

Any of the above described inverting and non-inverting gate voltage channel induced semiconductor device with operating characteristics similar to multiple device Complimentary Metal Oxide Semiconductor (CMOS) systems can further comprise a voltage bias source connected across aid electrically non-interconnected essentially non-rectifying source junctions so that they are held at different voltages, said voltage bias source optionally providing contact to the back of said semiconductor substrate.

A present invention modulator is described as comprising in use, two oppositely facing electrically interconnected rectifying diodes in intrinsic, or a single doping type semiconductor, each of said electrically interconnected rectifying diodes having an accessible terminal, wherein a forward direction of rectification of each of said electrically interconnected rectifying diodes changes depending upon what doping type, (N or P), be it metallurgically or field induced, is present in the semiconductor. Said modulator further comprises gate means for field inducing effective doping type in said semiconductor, said gate means being set off from said semiconductor by insulating material, such that during use application of sufficient positive voltage to said gate will attract electrons to said semiconductor channel region, and such that application of sufficient negative voltage to said gate will attract holes to said semiconductor channel region, the purpose of applying such gate voltage being to modulate the effective doping type of said semiconductor channel region between the source and drain junctions, said source junction being essentially non-rectifying, and said drain junction being rectifying, and each of said electrically interconnected rectifying diodes having a non-electrically interconnected terminal, such that, in use, a varying voltage is applied between the non-electrically interconnected terminals of the oppositely facing rectifying diodes, and a varying voltage is monitored at the electrical interconnection between said two oppositely facing rectifying diodes, which monitored varying voltage is a modulated function of said varying voltage applied between the non-electrically interconnected terminals of the oppositely facing rectifying diodes and a varying applied gate voltage, said monitored varying voltage being essentially electrically isolated from said varying applied gate voltage and appearing at said electrical interconnection between said two oppositely facing rectifying diodes primarily through one of said oppositely facing rectifying diodes which is caused to be forward biased as a result of semiconductor doping type modulation caused by application of said varying gate voltage.

A present invention gate voltage channel induced semiconductor device with operating characteristics similar to a non-latching SCR, can be described as a gate voltage channel induced semiconductor device being formed in intrinsic or a single doping type semiconductor and comprising two junctions, termed source and drain, which are separated by a semiconductor channel region, wherein a gate, to which semiconductor channel region doping effecting voltage can be applied, is associated with said semiconductor channel region, said gate being offset from said semiconductor channel region by insulating material. During use application a sufficient positive voltage to said gate will attract electrons to said semiconductor channel region, and application of sufficient negative voltage to said gate will attract holes to said semiconductor channel region, the purpose of applying such gate voltage being to modulate the effective doping type of said semiconductor channel region between the source and drain junctions, said source junction being essentially non-rectifying, and said drain junction being rectifying. Said gate voltage channel induced semiconductor device with operating characteristics similar to a non-latching SCR further comprises a source of voltage, such that during operation a voltage is applied therefrom across said source and drain junctions, and application of a gate voltage controls effective semiconductor channel region doping type in said channel region, and thus if said rectifying drain junction forward conducts or does not forward conduct, thereby controlling the flow of current through rectifying drain junction between reverse bias and forward bias levels. Again, the basis of operation is that said rectifying drain junction is comprised of materials(s) that form a rectifying junction to a semiconductor channel region when it is doped either N or P-type by either metalurgical or field induced means.

In any of the described present invention semiconductor devices (eg. inverting and non-inverting gate voltage channel induced semiconductor device with operating characteristics similar to multiple device Complimentary Metal Oxide Semiconductor (CMOS) systems, modulators and non-latching SCR's), at least one present junction (eg. source or drain), can be characterized by at least one selection from the group consisting of: (being formed in a region etched into the semiconductor, being formed by a process comprising vacuum deposition of said material(s) onto said semiconductor, being formed by a process comprising diffusion of said material(s) into said semiconductor, being formed by a process comprising ion-implantation of said material(s) into said semiconductor, and being comprises of material(s) which form a barrier height of approximately half the band-gap of the semiconductor).

In any of the described present invention semiconductor devices, (eg. inverting and non-inverting gate voltage channel induced semiconductor device with operating characteristics similar to multiple device Complimentary Metal Oxide Semiconductor (CMOS) systems, modulators and non-latching SCR's), the semiconductor substrate can further comprise at least one region of parasitic current flow blocking material therein which is optionally physically separate from the semiconductor device and presents parasitic currents from flowing to or away therefrom through said region of parasitic current flow blocking material; which at least one region of parasitic current flow blocking material forms rectifying junctions with both N and P-type field induced semiconductor.

It is also noted that an inverting gate voltage channel induced semiconductor device can be fabricated by a five mask procedure comprising, in a functional order, the steps of:

a. providing a silicon substrate from the group consisting of: (intrinsic and doped);

b. growing a depth of silicon dioxide atop thereof for use as a gate oxide adjacent to a gate voltage field induced channel region;

c. optionally implanting N or P-type channel doping regions;

d. etching two source openings through said silicon dioxide to e. depositing aluminum atop the silicon dioxide such that it contacts the silicon through the two etched source openings;

f. etching an "8" shaped pattern around the sources through the aluminum and silicon dioxide to the silicon so that one source is present in each of said regions of said "8" shaped pattern using a second mask and photolithography techniques, (or alternatively etching only a region between the two source openings from step d.);

g. optionally continuing said etch performed in step f. into said silicon;

h. depositing a material which forms rectifying junctions with either N or P-type silicon when in contact therewith and annealed, and annealing to form rectifying junctions where said deposited material contacts said silicon;

i. by selective acid etching removing un-reacted material which was deposited in step h.;

j. delineating the sources from the gates which surround each of said sources and which are surrounded by said etched "8" pattern, said gates being the aluminum deposited in step e. and remaining present between each said source and said "8" shaped pattern using a third mask and photolithography techniques, (or alternatively around the region between the two source openings from step d.);

k. depositing insulator over the entire surface of the structure;

l. etching openings through said insulator to provide access the gates, sources and "8" shaped region, (or alternatively etching only a region between the two source openings from step d.), using a forth mask and photolithography techniques;

m. depositing aluminum over the entire surface of the deposited insulator;

n. etching said aluminum deposited in step m. to delineate two sources, "8", (or alternatively only a region between the two source openings from step d.) and gate contact pads using a fifth mask and photolithography techniques; and o. optionally performing a sinter anneal so that aluminum deposited in step m. and delineated into contact pads in step n. makes good electrical contact with regions etched open in step l. to access said gates, source and said "8" shaped region, (or alternatively on a region between the two source openings from step d.).

A simpler, three mask fabrication procedure for Inverting Single Device CMOS is:

a. select intrinsic silicon as a semiconductor and grow a gate enabling depth, (eg. 10 to thousands of Angstroms), of silicon dioxide atop thereof;

b. use a first Mask to open an "8" shape through the silicon dioxide to the silicon, possibly including undercutting of the silicon dioxide, said "8" shape having width and being accessable at the midpoint between the sides of the "8" shape;

c. deposite a material, (eg. chromium), which when annealed in contact with silicon forms a junction which is rectifying with either N or P-type filed induced silicon, then anneal and then rinse off unreacted deposited, eg. where chromium is utilized a mixture of perchloric acid and cerric ammonium nitrate and water works well);

d. using a second mask open regions inside each side of the "8" shape to the silicon, optionally including a step to rough up the silicon surface so as to enhance the ability to form an ohmic junction therewith;

e. deposit a material, (eg. aluminum) over the entire surface of the intrinsic silicon.

f. using a third mask delineate device regions inside each side of the "8" shape from the surrounding regions, and to delineate the material which contacts the midpoint between the sides of the "8" shape from eqch of the sides of the "8" shape.

A non-inverting gate voltage channel induced semiconductor device can be fabricated by a procedure comprising, in a functional order, the steps of:

a. providing a silicon substrate selected from the group consisting of: (intrinsic and doped);

b. growing a depth of silicon dioxide atop thereof for use as a gate oxide adjacent to a gate voltage induced channel region;

c. optionally implanting N or P-type channel doping regions;

d. etching an "8" shaped pattern through said silicon dioxide to the silicon using a first mask and photolithography techniques;

e. depositing aluminum atop the silicon dioxide such that it contacts the silicon through said etched silicon dioxide;

f. etching open drain regions inside each of said "8" shaped pattern regions etched open in step d. through said aluminum and silicon dioxide to the silicon using a second mask and photolithography techniques;

g. optionally continuing said etch performed in step f. into said silicon;

h. depositing a material which forms rectifying junctions with either N or P-type silicon when in contact therewith and annealed, and annealing to form rectifying junction where said deposited material contacts said silicon;

i. by selective acid etching removing un-reacted material which was deposited in step h.;

j. delineating the gates which surround each of said drains from the surrounding etched "8" pattern, said gates being the aluminum deposited in step e. and remaining present between each said drain and said "8" shaped pattern using a third mask and photolithography techniques;

k. depositing insulator over the entire surface of the structure;

l. etching openings through said insulator to provide access said gates, drains and said "8" shaped region using a forth mask and photolithography techniques;

m. depositing aluminum over the entire surface of the deposited insulator;

n. etching said aluminum deposited in step m. to delineat two drains, "8" and gate contact pads using a fifth mask and photolithography techniques; and o. optionally performing a sinter anneal so that aluminum deposited in step m. and delineated into contact pads in step n. makes good electrical contact with regions etched open in step l. to access said gates, drains and said "8" shaped region.

(As for the case of the inverting gate voltage channel induced semiconductor device fabrication procedure, the "8" shaped region can be replaced by a simple opening between what are the drain openings opened in step f.).

It is to be particularly appreciated that no high cost diffusions are required in the above demonstrative, non-limiting fabrication procedures, and that only five photolithographic masking steps are required in each. The optional ion implants, (when performed), serve to provide a channel depth region of doping and effectively form a doped semiconductor on insulator (the insulator being the intrinsic semiconductor region beyond the channel region), system where intrinsic semiconductor is initially present. It is to be understood that current flow limiting, device isolating, non-conductive intrinsic silicon is preferred, though not limiting, as the beginning semiconductor system for gate voltage channel induced semiconductor devices and that purely field induced doping is sufficient for operability thereof.

It is also to be understood that fabrication procedures other than those described can also be practiced to the end that present invention inverting or non-inverting gate voltage channel induced semiconductor devices are realized, and that said resulting present invention inverting or non-inverting gate voltage channel induced semiconductor devices remain within the scope of the present invention.

It is also noted that the present invention has application to semiconductor devices formed in Gallium-Arsonide, as well as in Silicon. In particular it is difficult to dope GaAs greater than about $10^{18}$ per cm$^3$, and aluminum does not form a good ohmic junction to semiconductor doped less than about $10^{20}$ per cm$^3$. This greatly limits realization of devices in GaAs. However, while it is difficult to form high metallurgical concentrations in N-type GaAs, it is noted that field induced concentrations can be formed in MOSFET-type channel regions, and a highly concentrated channel region adjacent to a metal contact can be driven to be essentially ohmic by application of a sufficiently high, channel region inducing, Gate voltage. The same effect, of course, is available to devices from in Silicon, and other semiconductors.

Also, it is noted that copper or other metal can replace aluminum in the recited demonstrative, non-limiting fabrication procedures, and that additional steps can include deposition of materials to help secure deposited metals and formed silicides etc. In fact, a few percent copper in aluminum can greatly reduce electromigration effects which can degrade devices in which aluminum is used as a contact metal in semiconductor devices. Further, polysilicon and other type gates can be formed in place of metal gates in present invention semiconductor devices.

The present invention will be better understood by reference to the Detailed Description Section of this Disclosure, in conjunction with the accompanying Drawings.

SUMMARY OF THE INVENTION

It is a purpose of the present invention to provide examples of application of material which forms rectifying junctions with either N or P-type semiconductor.

It is another purpose yet of the present invention to describe semiconductor devices, the operational basis of which relies upon the fact that certain materials form rectifying junctions with either N or P-type doped semiconductor, whether metallurgical or field induced, in a manner which compliments the description found in U.S. Pat. Nos. 5,663,584 and 5,760,449 to Welch.

It is a further purpose yet of the present invention to teach simple five mask fabrication procedures for inverting and non-inverting gate voltage channel induced semiconductor devices which have operating characteristics similar to inverting and non-inverting multiple device conventional (CMOS) systems.

It is yet another purpose of the present invention to make clear that any rectifying or ohmic junction structure geometry, whether present in a region etched into semiconductor or not, and that any gate structure, metal or polysilicon etc. is within the scope of present invention gate voltage channel induced semiconductor devices which have operating characteristics similar to inverting and non-inverting multiple device conventional (CMOS) systems.

It is still yet another purpose of the present invention to describe biasing and operational characteristics of devices which utilize materials which form rectifying junctions with either N or P-type semiconductor, and in particular to describe such operation of inverting gate voltage channel induced semiconductor devices formed in essentially intrinsic semiconductor which have operating characteristics similar to inverting multiple device conventional (CMOS).

It is a further purpose of the present invention to make clear that the preferred embodiment thereof includes inverting and non-inverting single device equivalents to dual device seriesed N and P-Channel MOSFETS CMOS systems comprising two oppositely facing rectifying diodes in intrinsic, or a single doping type semiconductor, wherein said rectifying diode direction of rectification changes depending upon what doping type, (N or P), be it metallurgically or field induced, is present in the semiconductor, said inverting and non-inverting single device equivalents to dual device seriesed N and P-Channel MOSFETS CMOS systems further comprising gate means for field inducing effective doping type in said semiconductor, and wherein a voltage monitored at an electrical contact between said rectifying diodes responds as a function of applied gate voltage, but is essentially electrically isolated therefrom.

It is a further purpose still of the present invention to make clear that a semiconductor device in a semiconductor substrate, comprising at least one junction which is formed from non-semiconductor substrate and semiconductor substrate components, wherein said junction non-semiconductor substrate component is comprised of materials(s) which form a rectifying junction with either n or p-type semiconductor, whether metallurgically or field induced, can be fabricated by any functional technique, (eg. procedures comprising vacuum deposition, ion-implantation and/or dopant deposition and diffusion, optionally combined with any accompanying anneals etc.), and remain within the scope of the present invention.

It is another purpose of the present invention to describe application of material(s) which form rectifying junctions with either N or P-type semiconductor to provide modulators and non-latching SCR's.

Other purposes will be evident from a reading of the Disclosure and Claims.

BRIEF DESCRIPTION OF THE DRAWINGS

FIGS. 6b–6e show various Schottky barrier and ohmic to semiconductor junction geometries.

FIGS. 7b–7e show various Schottky barrier and ohmic to semiconductor junction geometries.

DETAILED DESCRIPTION

Figure 1:
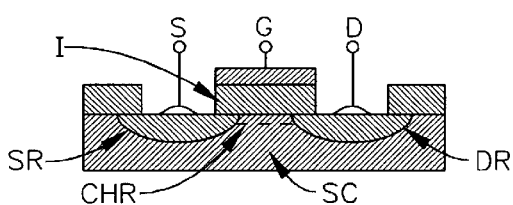
FIG. 1 shows a typical diffused junction (MOSFET) configuration.

Turning now to the Drawings it is noted that discussion with respect to FIGS. 1–14b provide necessary or beneficial background insight to the present invention. FIG. 1 shows a typical (MOSFET) configuration of a Semiconductor (SC), with an Insulator (I) present atop a surface thereof, atop which Insulator (I), (eg. $SiO_2$ where the semiconductor is silicon), there is present a Gate (G) metal. Also shown, at ends of a Channel Region (CHR) present under said Gate (G), in the Semiconductor (SC), are Source Region (SR) and Drain Region (DR). In conventional Diffused Junction (MOSFETS) the Semiconductor is of a metallurgical doping type (ie. N or P-type), and the Source Region (SR) and Drain Region (DR) are both of the opposite metallurgical doping type, (ie. P or N-type, respectively). When voltage is applied between the Gate (G) and the Source Contact (S), and is of a polarity appropriate to invert the Semiconductor metallurgical doping type, then an "inverted" doping type channel appears in the Channel Region (CHR) and current can flow between the Drain Contact (D) and the Source Contact (S). This is as desired. (Note for general purposes that a Negative Polarity Voltage applied Gate to Source will caused accumulation of Holes in a (MOSFET) Channel Region, and that application of a Positive Polarity Voltage Gate to Source will caused accumulation of Electrons in a (MOSFET) Channel Region. Sufficient Positive Polarity Gate to Source Voltage will "Invert" a P-type Channel Region to N-type and sufficient Negative Polarity Gate to Source Voltage will "Invert" an N-type Channel Region to P-type).

Figure 2:
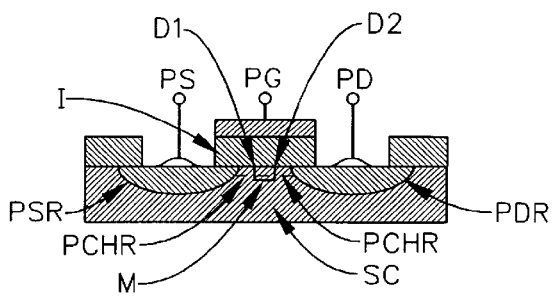
FIG. 2 shows the presence of a material in an otherwise (MOSFET) current pathway.

While geometrically-similar to what is shown in FIG. 1, FIG. 2 shows an assumed Parasitic (MOSFET) formed in a Semiconductor (SC) surface region. Shown are said Semiconductor (SC), a Parasitic Gate (PC), Parasitic Source Region (PSR) and Parasitic Drain Region (PDR), insulator (I), and Parasitic Channel Region (PCHR). Also shown in FIG. 2 is the system of the present invention in the form of additional component Material (M) in the Parasitic Channel Region (PCHR), with associated Rectifying Regions (D1) and (D2) adjacent to left and right sides of said Material (M), in said Parasitic Channel Region (PCHR). It is important to note that said Material (M) forms junctions with the Semiconductor (SC) at two locations, (eg. (D1) and (D2)), and that said junctions are oppositely directed, (see FIGS. 3 and 4). In the preferred embodiment of the present invention said Material (M) forms rectifying junctions at Rectifying Regions (D1) and (D2), where said Semiconductor (SC) is either N or P-type because of either metallurgical or field induced doping in the Parasitic Channel Region (PCHR). It is noted that the Parasitic Gate (PG) can be an interconnection trace in an integrated circuit and that the Parasitic Source Region (PSR) and Parasitic Drain Region (PDR) can be a Source and/or Drain of intended (MOSFET's) in an integrated circuit, such as shown in FIG. 1.

The present invention can include geometries identified by FIGS. 1 and 2, where the (SR) and (DR) or (PSR) and (PDR) and (M) regions are considered to be formed by other than typical N and P-type dopants. For instance, where said (SR) and (DR) region in FIG. 1 are considered to be doped with a Mid-Bandgap Doping Material for the semiconductor substrate (SC) present, (eg. chromium doping in (SR) & (DR) in silicon (SC)), then the basic structures of present invention non-inverting single device with operating character characteristics similar to conventional diffused junction multiple device CMOS systems results. This can be appreciated by comparison of the FIG. 1 device geometry with the present invention device geometries shown in FIGS. 6b, 6c, 6d and 6e. Addition of a Midpoint (MP) to FIG. 1 so interpreted, results in said FIGS. 6b, 6c, 6d and 6e. As well, where the geometry of FIG. 2 is interpreted to have the (PSR) and (PSD) regions comprised of material(s) which form essentially ohmic contacts to the semiconductor substrate (SC) regions, and the Material (M) is a mid-bandgap doping material for the semiconductor substrate (SC) present, (eg. Chromium (SR) (DR) in silicon (SC)), then one need only add a Midpoint (MP) contact to arrive at the present invention geometries of FIGS. 7b, 7c, 7d and 7e, where the (M) of FIG. 2 is the (SBFM) of said FIGS. 7b, 7c, 7d and 7e.

Figure 3:
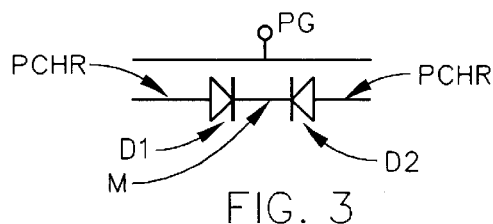
FIG. 3 shows diagramatically the rectification arrangement system of the present invention where metallurgical doping controls.
Figure 4:
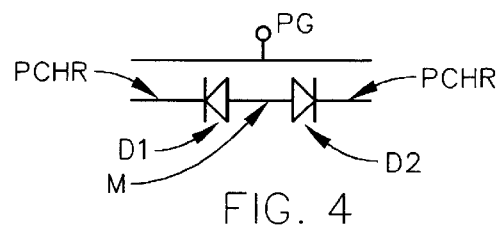
FIG. 4 shows diagramatically the rectification arrangement system of the present invention where field induced inverted doping controls.

FIG. 3 shows that where the Semiconductor (PCHR) of FIG. 2 is P-type oppositely facing rectifying junctions in Rectifying Regions (D1) and (D2) have negative or cathode interconnection, and FIG. 4 shows that where the Semiconductor of FIG. 2 is N-type, oppositely facing rectifying junctions in Rectifying Regions (D1) and (D2) have positive or anode interconnection. The point being that where Material (M) is able to form a Rectifying junction with either N or P-type Semiconductor, a current flow in the Parasitic Channel Region (PCHR) of FIG. 2 can not occur because regardless of the Polarity of a current flow driving voltage present between Parasitic Drain (PD) and Parasitic Source (PS), a Reverse Biased diode will appear in said Parasitic Channel Region (PCHR) at one or the other of Rectifying Regions (D1) and (D2).

In one sense the method of the present invention involves designing masking and fabrication procedures, and carrying out steps of fabrication, such that the Material (M) shown in the FIG. 2 Parasitic Channel Region (PCHR) is present in regions in, for instance, integrated circuits, wherein potential parasitic current flows can occur but are undesirable. (It is noted that materials which form rectifying junctions with either N or P-type semiconductor can be deposited on and annealed to a semiconductor substrate or deposited and diffused thereinto, or ion implanted thereinto and activated by anneal etc. An functional method by which said material(s) can be placed where desired in a semiconductor substrate can be practiced).

Figure 5:
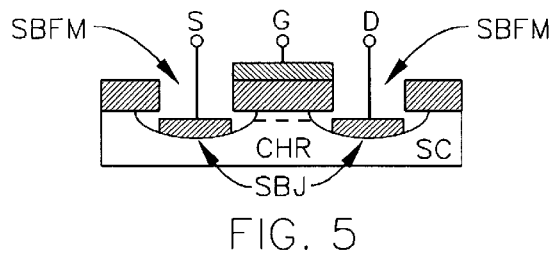
FIG. 5 shows a Schottky barrier (MOSFET) configuration.
Figure 6A:
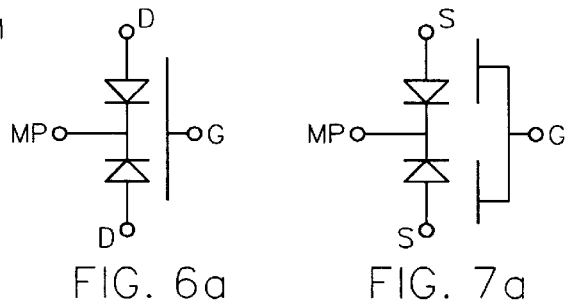
FIGS. 6a and 6b show a circuit symbol and side cross-sectional of a non-inverting gate voltage channel induced semiconductor single device equivalent to (CMOS).
Figure 7A:
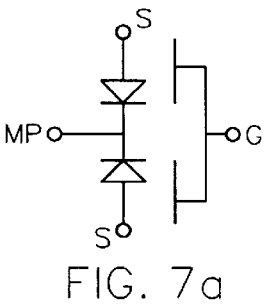
FIGS. 7a and 7b show a circuit symbol and side cross-sectional of an inverting gate voltage channel induced semiconductor single device equivalent to (CMOS).
Figure 6B:
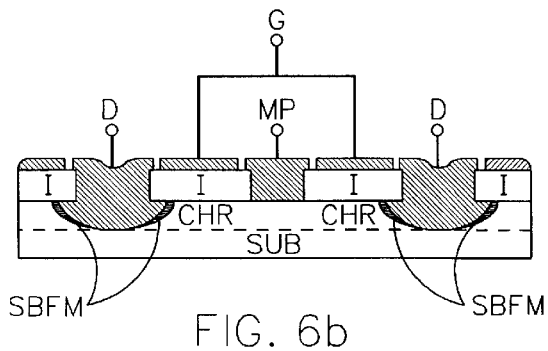
Figure 7B:
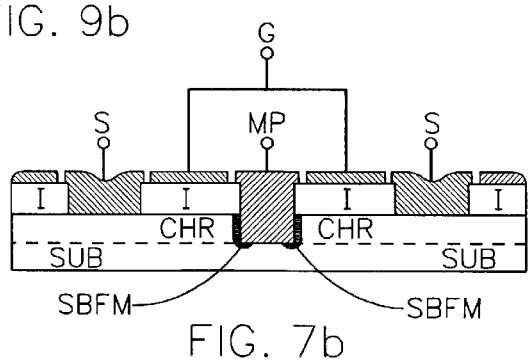
Figure 7C:
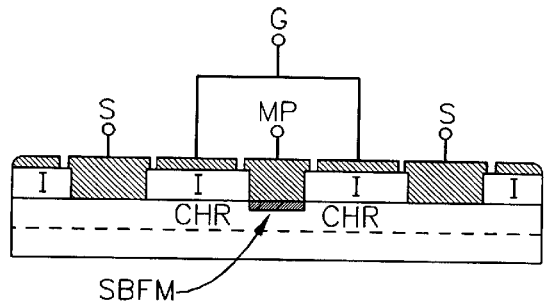
Figure 7D:
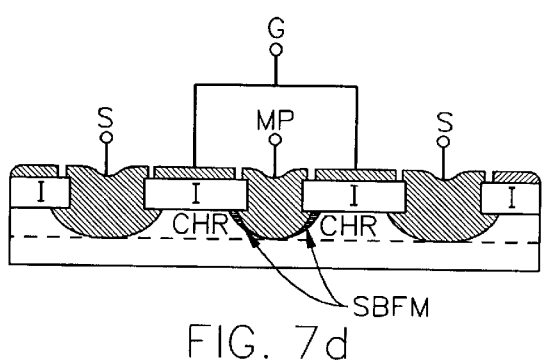
Figure 7E:
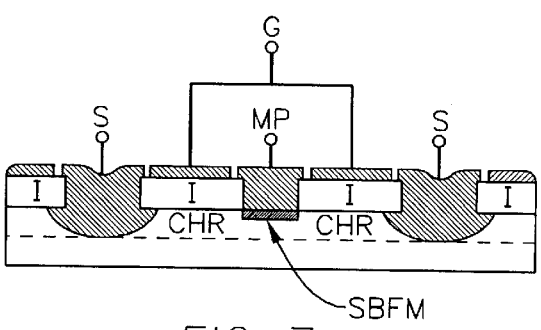
Figure 7F:
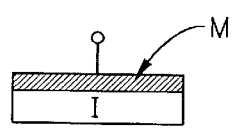
FIGS. 7f and 7g shows two possible gate structures.
Figure 8:
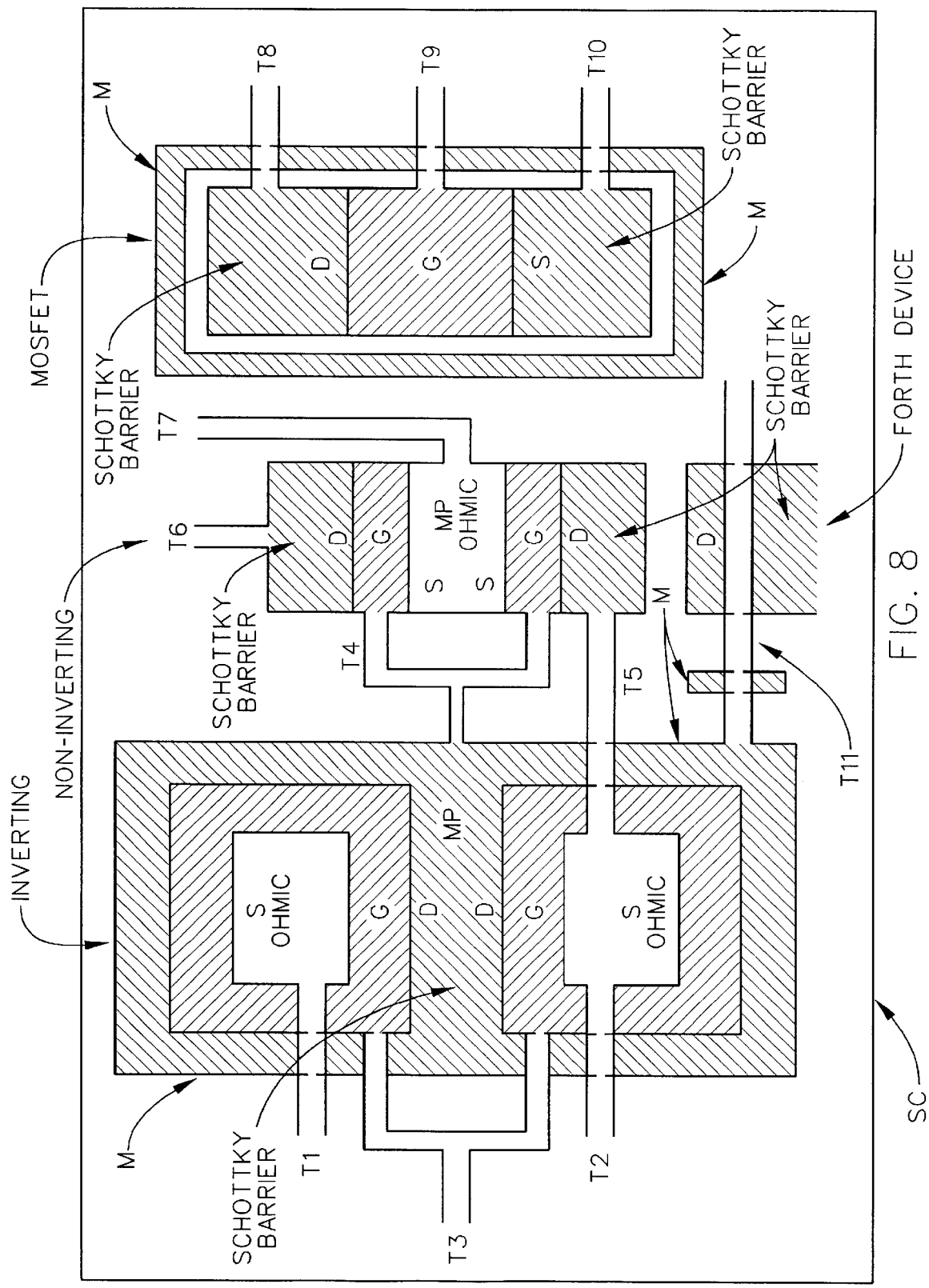
FIG. 8 shows a top view of a semiconductor system comprising an inverting gate voltage channel induced semiconductor single device equivalent, and non-inverting gate voltage channel induced semiconductor single device equivalent to (CMOS), with parasitic current flow blocking material placed therebetween in positions which might otherwise have current flow therebetween.

The present invention, as applied in parasitic current flow blocking applications, finds relevant, though not exclusive application in (MOS) systems, (eg. FIG. 1), particularly where Schottky barriers are utilized at Source (S) and Drain (D) of (MOSFETS) (eg, FIG. 5), and wherein device isolation can be problematic. Note, U.S. Pat. No. 5,663,584 to Welch describes (MOSFET) systems, (including single device equivalents to (CMOS)), which utilize Schottky barrier junctions comprised of semiconductor and a material which forms rectifying junctions with either N or P-type semiconductor material. Said 584 Patent is incorporated by reference herein and it is noted, documents conception of the principal behind the present invention as applied to parasitic current flow blocking. It is noted, however, that the 584 Patent disclosed isolation of Drain current flow in inverting single device equivalents to CMOS, particularly as regards FIG. 10q thereof, the essence of which is repeated in FIG. 8 herein. (FIG. 8 shows that device isolation can be effected by material as described). FIG. 5 herein is included to provide general non-limiting, (other possible junction geometries are as shown in FIGS. 6b–6e and 7b–7e), insight to a Schottky barrier (MOSFET) geometry configuration. The major distinction of Schottky barrier (MOSFETS) is that the Source and Drain regions comprise Schottky barrier forming material (SBFM). FIGS. 6b and 7b show, respectively, non-limiting representations of non-inverting and inverting gate voltage channel induced semiconductor single device equivalents to (CMOS), which are described in detail in the 584 Patent. The FIG. 6b and 7b devices are shown as fabricated upon an insulating substrate (SUB), (which can comprise intrinsic semiconductor), and it is noted that the identifier "MP" indicates an electrically isolated Midpoint terminal similar to a midpoint of a conventional (CMOS) system. The identifier (CHR) identifies Channel Region(s), (possibly extended (SUB) intrinsic semiconductor with field induced doping present). Note Schottky barrier junctions in FIGS. 6b and 7b are shown as present in etched semiconductor regions. Again, the shown junctions geometry is not limiting and all junctions, both Schottky barrier and ohmic can be formed in etched semiconductor regions, or only the ohmic or rectifying junctions might be present in etched semiconductor regions. A purpose of using etched semiconductor regions is to place junctions under a Gate to avoid reduced gate voltage control over channel end field induced doping, and accompanying current flow limiting high resistance, however, a similar result can be achieved by diffusing a material into a non-etched semiconductor substrate, (eg. diffuse mid-bandgap chromium into silicon, much like how boron or phosphorous is diffused into silicon to provide P and N-type doped regions, rather than deposit chromium onto silicon and annealing the result to form chromium disilicide).

Figure 6C:
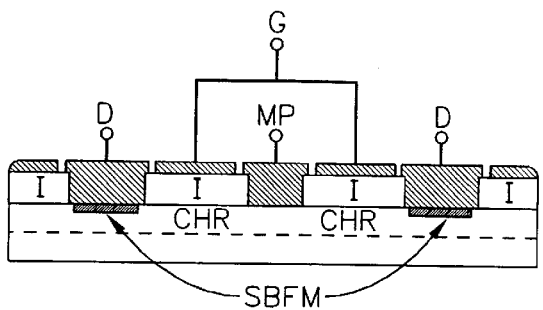
Figure 6D:
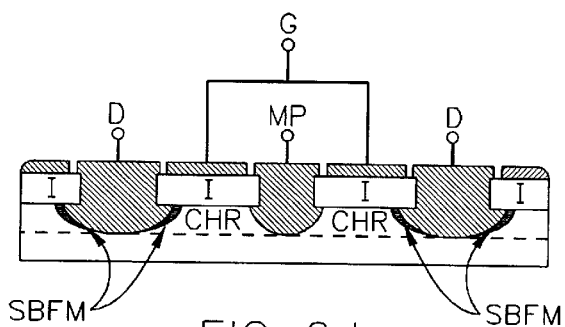
Figure 6E:
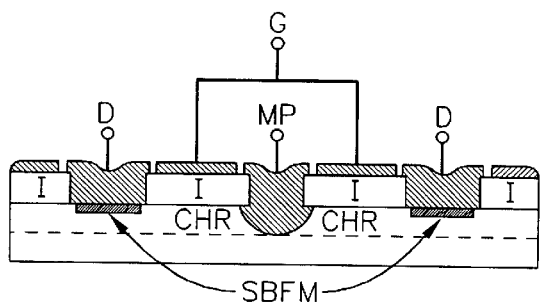
Figure 6F:
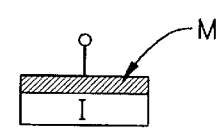
FIGS. 6f and 6g shows two possible gate structures.
Figure 6G:
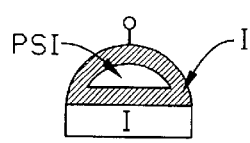
Figure 7G:
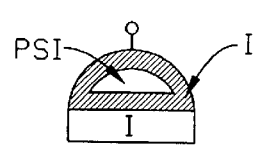

The Inverting and Non-inverting gate voltage channel induced semiconductor single device equivalents to (CMOS) of FIGS. 7b and 6b are better described, in words, in the Disclosure of the Invention Section of this Disclosure. FIGS. 7a and 6a show, respectively, circuit diagrams for inverting and non-inverting gate voltage channel induced semiconductor single device equivalents to multiple device conventional (CMOS), and correspond to the side cross-sections shown in FIGS. 7b and 6b, respectively. FIGS. 6c–6e and 7c–7e show Figures similar to FIGS. 6b and 7b with additional, non-limiting, junction geometries demonstrated, and FIGS. 6g and 7g show non-limiting polysilicon Gate Structure functional equivalents to FIG. 6f and 7f Gates, and are to be considered as interchangeably present in FIGS. 6b–6e & 7b–7e. The Gate structure is not determinative of the present invention, but rather the principal of the present invention is that a material be present which forms rectifying junctions with both N and P-type semiconductor whether metallurgically or field induced.

It is noted with reference to the system of FIG. 6b, that if voltage is applied between the Midpoint (MP) and one of the Drains (D), or with reference to FIG. 7b, if voltage is applied between the Midpoint (MP) and one of the Sources (S), then application of a channel region effective doping type Gate (G) voltage can control the direction of rectification which said device would demonstrate. That is a gate voltage channel induced semiconductor gate voltage controlled rectification direction device and gate voltage controlled switch with operating characteristics similar to a non-latching Silicon Controlled Rectifier (SCR) is formed. As well, it is noted that if Schottky barrier (MOSFETS) as shown in FIG. 5 are formed on both N and P-type semiconductor, said resulting P-channel and N-channel Schottky barrier (MOSFETS) can be combined into a (CMOS) system by electrical interconnection of non-semiconductor components of Schottky barriers from the two gate voltage channel induced semiconductor devices, and electrical interconnection of the Gates.

FIG. 8 shows a top view of a demonstrative semiconductor system (SC) comprising, sequentially, an Inverting, (see FIGS. 7b–7e for cross-section elevational view), gate voltage channel induced semiconductor single device equivalent, and a Non-inverting, (see FIGS. 6b–6e for cross-section elevational view), gate voltage channel induced semiconductor single device equivalent to (CMOS), and a Schottky barrier (MOSFET). Note that in the Inverting gate voltage channel induced semiconductor single device equivalent to (CMOS) case parasitic current flow blocking material (M) is placed so as to effectively surround ohmic Sources (3), and comprises rectifying Schottky barrier Drain (D) junctions to the semiconductor. Unintended current flow from the Sources (S) of the Non-inverting gate voltage channel induced semiconductor single device equivalent to (CMOS) is thus blocked. It is noted that the encircling Schottky barrier material (M) associated with the (MOSFET) acts as a parasitic current blocking material between Source (S) and Drain (D) therein and Drains and Sources in the Non-inverting gate voltage channel induced semiconductor single device equivalent to (CMOS). Note also the demonstrative presence of Traces (T1)–(T10) Traces (T1) and (T2) serve to provide electrical access to electrically non-interconnected Sources (S) of the Inverting gate voltage channel induced semiconductor single device equivalent to (CMOS). Trace (T3) provides electrical interconnection to the Inverting gate voltage channel induced semiconductor device Split Gates (G). Trace (T4) interconnects electrically interconnected Drains (D) of the Inverting gate voltage channel induced semiconductor single device equivalent to (CMOS), (which is analogically similar to an essentially electrically isolated, from the Gate thereof, terminal in a conventional CMOS system), to the Split Gates (G) of the Non-inverting gate voltage channel induced semiconductor single device equivalent to (CMOS). Trace (T5) provides electrical interconnection of the lower Source (S) of the Inverting gate voltage channel induced semiconductor single device equivalent to (CMOS) to the lower Drain (D) of the Non-inverting gate voltage channel induced semiconductor single device equivalent to (CMOS) and Trace (T6) provides access to the upper Drain (D) of the Non-inverting gate voltage channel induced semiconductor single device equivalent to (CMOS). Trace (T7) provides output from the electrically interconnected Sources (S) of the Non-inverting gate voltage channel induced semiconductor single device equivalent to (CMOS). Taken in combination the electrically-interconnected Inverting and Non-inverting gate voltage channel induced semiconductor single device equivalents to (CMOS) can be considered an Inverter with an Output Buffer Stage. Voltage input at Trace (T3) will control an inverted signal output at Trace (T7). Also shown is a Schottky barrier (MOSFET) with a surrounding isolating parasitic current blocking material (M). Traces (T8), (T9) and (T10) provide, respectively, electrical access to Drain (D), Gate (G) and Source (S) thereof. Trace (T11) is present to show that "Fan-out" from the Inverting gate voltage channel induced semiconductor single device equivalent to (CMOS) is possible, and the parasitic current blocking material (M)shown thereunder is present to indicate that said Trace (T11) can act as a parasitic MOSFET Gate and can invert semiconductor therebeneath and possibly cause parasitic currents to flow in said inverted semiconductor to a Drain (D) of a partially shown Forth device. Material (M) blocks said current flow as per FIGS. 2, 3 and 4. Trace (T11), (as well as other of the shown Traces), would most likely be present atop a deposited insulator which covers both the Material (M) and the Forth device Drain (D). (Importantly, note that the Forth Device could be a blocked element in an effective parasitic SCR configuration, which U.S. Pat. No. 4,300,152 identifies can be a problem in diffused junction based CMOS. FIG. 9b demonstrates application of the present invention to prevent parasitic four layer PNPN, (or NPNP), SCR-like device formation from PNP and NPN diffused junction transistors. Material "M" blocks parasitic currents.)

Figure 9A:
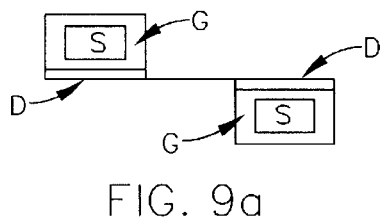
FIG. 9a shows that channel regions in gate voltage channel induced semiconductor single device equivalents to (CMOS) need not be physically aligned, and that electrical interconnection of junctions between channel regions need not be physically geometrically between said channel regions.
Figure 9B:
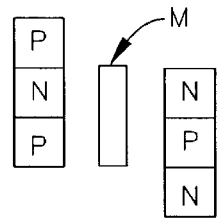
FIG. 9b demonstrates prevention of latch-up in PNPN SCR devices.

FIG. 9a shows that channel regions in gate voltage channel induced semiconductor single device equivalents to (CMOS) need not be physically aligned, and that electrical interconnection of junctions between channel regions need not be physically geometrically between said channel regions. This Figure serves to make clear that electrical contact to an electrical connection between channel regions via a junction can be effected with said junction located anywhere outside both channel regions. A particularly relevant example is where non-semiconductor components of rectifying Schottky barrier junctions to channel regions are electrically interconnected. The non-semiconductor components of the Schottky barrier junctions are interconnected "between" said channel regions, in the relevant electrical sense. While it should go without saying, the word "between" does not in any way imply a requirement of location of a junction or any other equivalent electrical continuity means which is physically, geometrically invariantly directly between channel regions.

Figure 10:
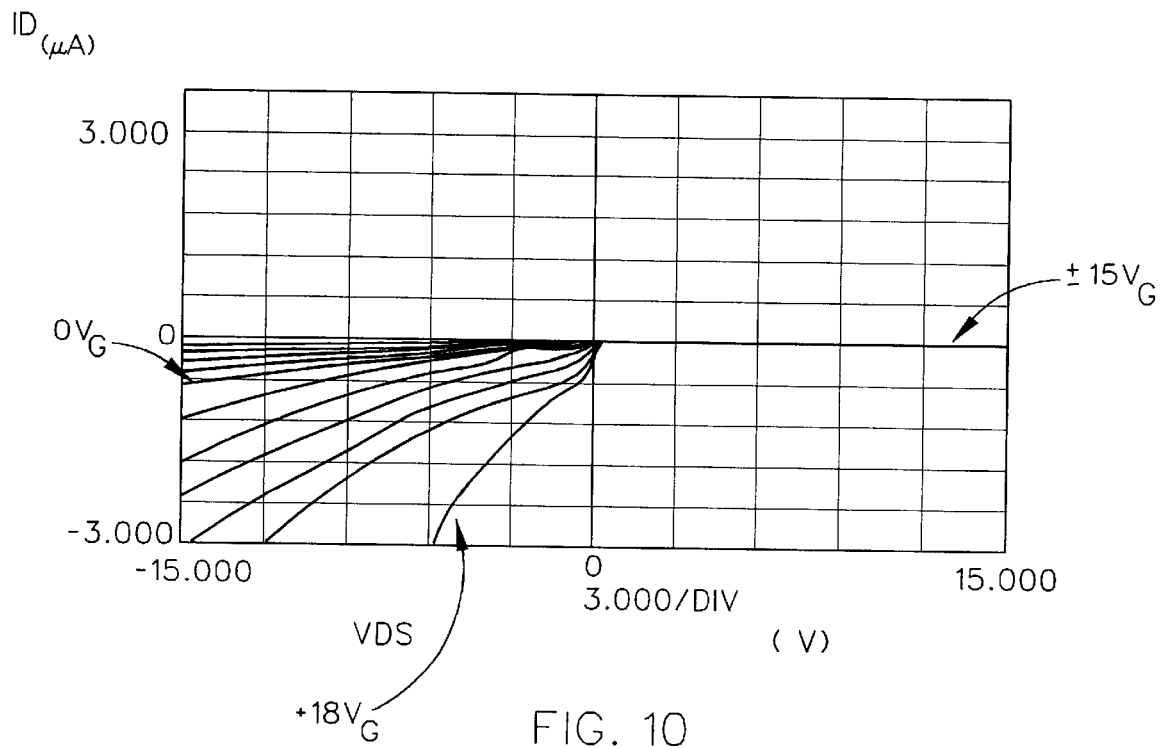
FIGS. 10 and 11 show operational Drain Current (ID) vs. Drain to Source Voltage (VDS), as a function of Gate Voltage (VG) for N-Channel and P-Channel (Schottky barrier MOSFETS) fabricated by the Applicant herein.
Figure 11:
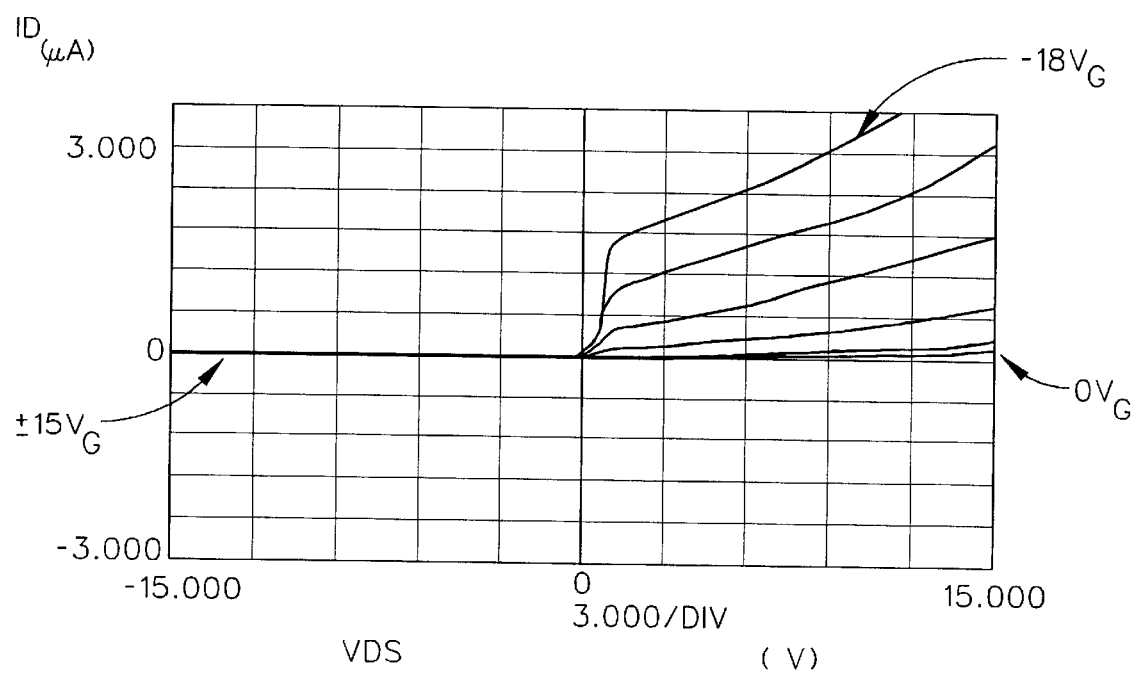
Figure 12A:
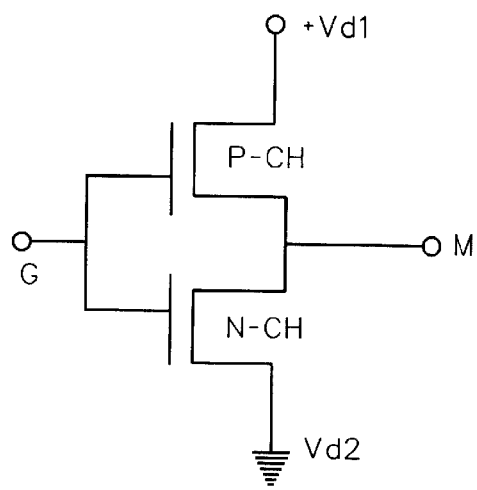
FIGS. 12a and 12b show, respectively, symbols for (CMOS) comprised of N and P-Channel MOSFETS, and a typical (CMOS) switching characteristic curve as a function of Gate Voltage (VG).
Figure 12B:
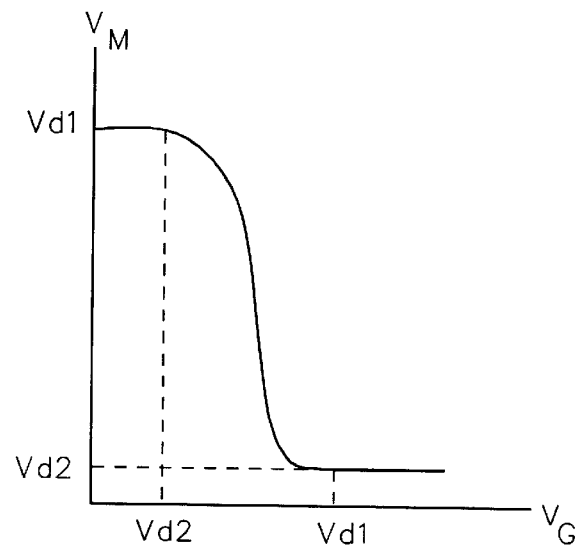
Figure 13A:
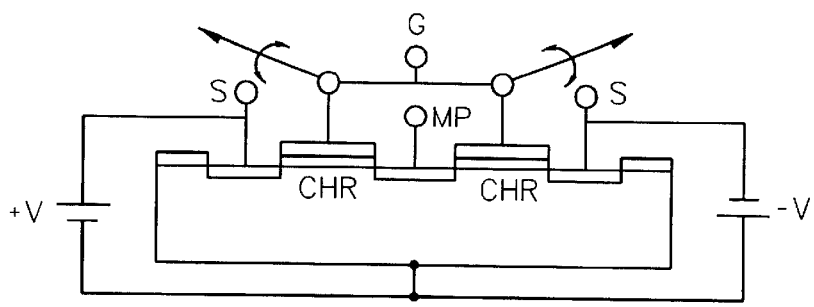
FIGS. 13a and 13b show two biasing schemes for an inverting gate voltage channel, induced semiconductor single device equivalent to (CMOS).
Figure 13B:
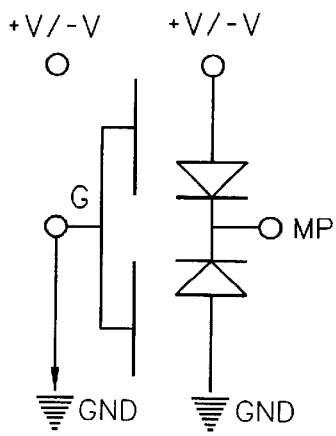

FIGS. 10 and 11 show operational Drain Current (ID) vs. Drain to Source Voltage (VDS), as a function of Gate Voltage (VG) for Schottky barrier (MOSFETS) fabricated by the Applicant herein. FIG. 10 is for an N-Channel and FIG. 11 is for a P-Channel (MOSFET). It is to be noted that the Applied Gate VG) and Drain to Source (VDS) voltages are of opposite polarities. This is in contrast to what is the case in all previously known MOSFETS. FIGS. 12a and 12b show, respectively, symbols for (CMOS) comprised of N and P-Channel MOSFETS, and a typical (CMOS) switching characteristic curve as a function of Gate Voltage (VG).

Figure 14A:
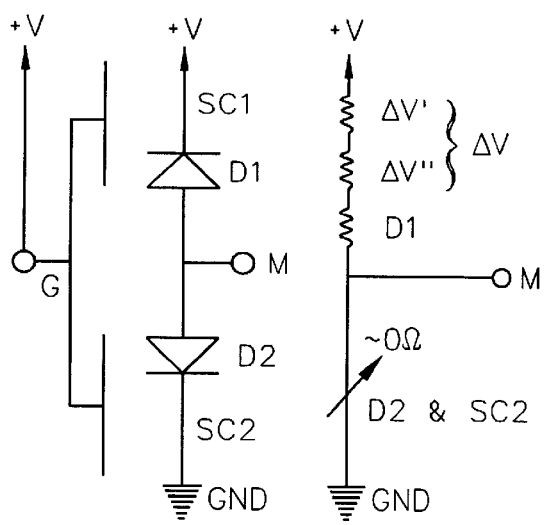
FIGS. 14a and 14b show two switching states for an inverting gate voltage channel induced semiconductor single device equivalent to (CMOS).
Figure 14B:
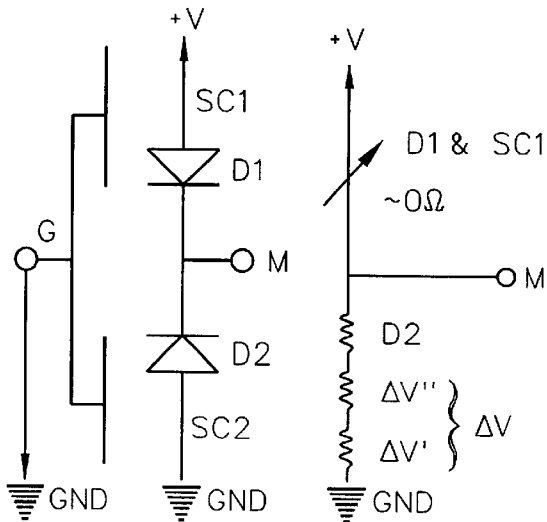

Note, said FIG. 12b switching characteristic also characterizes the operation of the present invention "inverting single device with operating characteristics similar to seriesed N and P-Channel MOSFETS CMOS systems", or as otherwise described as "Inverting gate voltage channel induced semiconductor device with characteristics similar to multiple device Complementary Metal Oxide Semiconductor (CMOS) systems", where VM represents the voltage monitored at point (M) in present invention representing FIGS. 14a and 14b, just as In FIG. 12a. Further, it is noted voltage present at said midpoint (M) in a present invention inverting device switches oppositely the applied Gate (G) voltage through an "ON" side of said present invention inverting device, wherein said "ON", (ie. forward conducting), side is shown in FIGS. 14a and 14b as being of approximately "O" ohms which results from a forward biased junction in series with an adjacent highly conductive channel region, into which the applied Gate Voltage attracts carriers. FIGS. 14a and 14b also show the "OFF", (-ie. not-forward conducting), side of a present invention inverting device has regions which cause drop of voltages, including an onset of pinchoff and a reverse biased junction, between which is a channel region.

In the foregoing, as regards the Inverting and Non-inverting gate voltage channel induced semiconductor single device equivalents to (CMOS), the rectifying Schottky barrier junctions are identified as Drains, and the essentially non-rectifying junctions are identified as Sources. These terms utilized as they are familiar in (MOS) device settings, but it is to be appreciated that there is no conventional significance to said designation other than to suggest that two (MOSFETS), each formed with one rectifying Schottky barrier junction and one ohmic junction can be combined into Inverting and Non-inverting gate voltage channel induced semiconductor single device equivalents to (CMOS) by appropriate interconnection of Rectifying Drains or Ohmic Sources, respectively. Note that gate voltage channel induced semiconductor single device equivalents to (CMOS) shown in FIG. 8 are formed with electrically interconnected integrated Drains (Inverting device) or integrated Sources (Non-inverting device). In the context of the Inverting and Non-inverting gate voltage channel induced semiconductor single device equivalents to (CMOS), other terminology could just as well have been utilized, (eg. such as "First" and "Second" junctions for Source/(Drain) and Drain/(Source) respectively). As regards the (MOSFET), however, the use of the terms Source and Drain is more conventional as both Source (S) and Drain (D) junctions are rectifying, and it is to be noted that the semiconductor can be either P or N-type where said Schottky barriers are formed using, for instance, silicon semiconductor and chromium disilicide. As better discussed in U.S. Pat. No. 5,663,584 to Welch, other possible candidates for rectifying Schottky barrier formation with silicon include. chromium, molybdenum, tungsten, vanadium, titanium and platinum, and silicides thereof.

It is also to be specifically understood that a rectifying drain junction in a present invention inverting gate voltage channel induced semiconductor device with operating characteristics similar to multiple device Complementary Metal Oxide Semiconductor (CMOS) systems can be formed between semiconductor and one or more materials that form a barrier height of approximately half the semiconductor bandgap. Further, is to be specifically understood that a present invention inverting gate voltage channel induced semiconductor device can be considered as an inverting single, device with operating characteristics similar to dual device seriesed N and P-Channel MOSFETS CMOS systems comprising two oppositely facing electrically interconnected rectifying diodes in a semiconductor, which diodes each comprise a junction between the semiconductor and one or more materials that form a barrier height of approximately half the semiconductor bandgap. As well, it is to be understood that any Gate technology (eg. metal, polysilicon etc.), and Insulator type (eg. $SiO_2$ etc.), and depth (eg. 20–3000 Angstroms), and any fabrication procedure which results in claimed systems is to be considered within the scope of the systems claimed.

It is noted that the inverting and non-inverting gate voltage channel induced semiconductor single device equivalents to (CMOS) can be utilized as modulators where both applied Gate (G) and Drain or Source voltages are simultaneously varied, and the voltage at the Midpoint (MP) monitored.

Continuing, the terminology "single device equivalents to (CMOS)" is to be understood to mean that each said "single device" is fabricated on a single type doping semiconductor, which can be N-type, P-type or Intrinsic. That is, there is no need to provide alternating N and P-type doped regions wherein P-Channel and N-Channel gate voltage channel induced semiconductor devices, respectively, can be formed. Note that this is not to be taken to mean that various doping type regions such as N-type, P-type and Intrinsic, can not be co-present in a semiconductor substrate in which a present invention "single device equivalent to (CMOS)" is fabricated. In fact it is emphasized that a present invention single device equivalent to CMOS structure can utilize an intrinsic semiconductor substrate with a channel region of a functional depth, (eg. Around one-hundred Angstroms or so), present therein just below an insulator -semiconductor interface, (such as is easily achieved by low energy ion-implantation). This is exemplified by FIGS. 6b and 7b where the channel region (CHR) is considered to be N or P-type doping in the surface region of an intrinsic semiconductor substrate (SUB). Also, the terminology "gate voltage-channel induced semiconductor device" is typically referred to in industry by the standard terminology "Metal Oxide Semiconductor or (MOS) device". While unlikely that confusion and undue interpretative limitation should develop, the terminology "gate voltage channel induced semiconductor device" has been adopted herein to make clear that the "Gate" can be other than just Metal per se., (eg, the Gate can be polysilicon etc.). That is, in FIGS. 6b and 7b the "G" and "I" combination are to be broadly interpreted as symbolically including any functional Gate structure, and FIGS. 6a and 7a are to be interpreted as generically symbolically representing the scope of the present invention as regards any Gate structure and rectifying and/or ohmic Junction structure etc, That is, any rectifying or ohmic Source or Drain junction can be present at a surface of a semiconductor, or in a region etched into a semiconductor. Further, where the terminology Metal Oxide Semiconductor Field Effect Transistor (MOSFET) or Metal Oxide Semiconductor (MOS) has been retained in this Disclosure and in the claims, it is to be understood that Gates in described devices can be other than just Metal per se., (eq. Polysilicon etc.) and do remain within the scope of said terminology. And, it is to be understood that any means for providing electrical discontinuity between Gate and Source and Drain regions in any device described in this Disclosure is to be considered within the scope of the present invention as Claimed. This includes, for instance, use of thick oxide and use of oxide side wall spacers etc. That is, the Doctrine of equivalents is to be considered liberally applicable. The basis of operation of the present invention is that certain materials form rectifying junctions with either N or P-type semiconductor whether said doping is metallurgically or field induced. Other elements and aspects of the present invention are not critical to said basis of operation and therefore are highly open to Doctrine of Equivalents, function maintaining substitution, particularly on an element by element basis. That is, for instance, substitution of a polysilicon or other Gate for a metal Gate does not materially change the present invention, nor does the forming of an ohmic or rectifying junction at a semiconductor surface or in an etched semiconductor region. While said demonstrative variations do provide geometrically different devices, they do not alter the basic underlying principal of operation of the present invention.

It is further noted that FIGS. 6d–6e and 7d–7e show various rectifying and ohmic junctions in isotropically etched semiconductor substrate regions, said semiconductor substrate etched regions are to be interpreted sufficiently broadly so as to include anisotropically etched semiconductor substrate regions as shown in FIG. 7b under the Mid Point (MP), wherein Schottky barrier forming material (SBFM) is accessed via contact metalization. FIGS. 6d–6e and 7d–7e are to demonstrate various etched and non-etched junction geometry locations, and not to exclude other possible junction geometries.

It is further to be understood that while gate voltage can be applied in inverting gate voltage channel induced semiconductor device with operating characteristics similar to multiple device Complimentary Metal Oxide Semiconductor (CMOS) systems with respect to the back of a semiconductor substrate, (see FIG. 13a), and thereby provide essentially equal gate voltage driving force for field inducing carriers into both channel regions, (eq. right and left channel regions (CHR) in FIG. 7b for instance); when said inverting gate voltage channel induced semiconductor device with operating characteristics similar to multiple device Complimentary Metal Oxide Semiconductor (CMOS) systems, (ie. Single Device CMOS), is biased with the electrically non-interconnected essentially non-rectifying source junctions (eg. see top and bottom sources (S) in FIGS. 7a and 13b for instance), are held at different voltages, (eg. one at ground and the other offset therefrom either positively or negatively), particularly when undoped intrinsic silicon is utilized as the starting semiconductor substrate material, then some special considerations apply regarding how the inverting gate voltage channel induced semiconductor device operates. This is because the gate voltage driving force effectively present for field inducing carriers into a channel region which is off during at a time during a switching procedure, is less than that present for field inducing carriers into a channel region which is on, as said gate voltage driving force effectively present for field inducing carriers into a channel region which is off, is with respect to voltage present at the mid-point thereof, (eg. see (MP) in FIGS. 7a and 7b, for instance).

To elaborate, it is again stated that the inverting gate voltage channel induced semiconductor device with operating characteristics similar to multiple device Complimentary Metal Oxide Semiconductor (CMOS) systems is basically two (Schottky barrier) junctions which comprise Semiconductor and Non-semiconductor elements, wherein the non-semiconductor elements are electrically interconnected, (and ohmically accessed at (MPH, to provide a series system in which the (Schottky barrier) junctions, (formed by SBFM in FIG. 7b), are faced in opposition to one another. The (Schottky barrier) junctions are both made from a non-semiconductor material, (eg. Chromium Disilicide), which forms rectifying junctions with either N or P-type Silicon, (the semiconductor used in fabrication efforts to date). When voltage is applied across the seriesed system of (Schottky barrier) junctions, assuming doping of the same type, (N or P), is present in the silicon associated with both (Schottky barrier) junctions, one said (Schottky barrier) junction is forward, and one said (Schottky barrier) junction is, by necessity, reverse biased. Now, said Single Device CMOS also has a Gate (G) associated with the silicon associated with both (Schottky barrier) junctions, and application of Gate Voltage serves to change the type of doping present in said silicon, (see supra herein for description of Device Structure), hence the voltage at the interconnection of the (Schottky barrier) junctions. In the Inverting Single Device CMOS the voltage at the interconnection of the (Schottky barrier) junctions is caused to decrease when the Gate Voltage is increased, and vice-versa. And note that where intrinsic semiconductor is utilized, until voltages are applied to the metallurgical structure, no doping, hence, rectifying junctions are present in the metallurgical structure. That is—the device does not even exist until Voltages are applied! The metallurgical structure can be described as:

Power Supply

A. (+V) applied to top source (S) in FIG. 7a
TOP HALF OF SINGLE DEVICE CMOS STRUCTURE, SEQUENTIALLY:

B. ohmic contact . . .
   first silicon channel (CHR) region . . .
   first chromium disilicide junction
C. ohmic contact to mid point (same contact as in bottom half)

Bottom Half of Single Device CMOS Structure, Sequentially:

C. ohmic contact to mid point (same contact as in top half)
D. second chromium disilicide junction . . .
   second silicon channel (CHR) region . . .
   ohmic contact . . .
POWER SUPPLY E. (GND) applied to bottom source (S) in FIG. 7a.
(For demonstration purposes it is assumed that a positive polarity bias voltage to ground is utilized and that the gate voltage switches between said positive polarity bias voltage and ground to effect and inverted output result. However, a negative voltage to ground is to be considered as equivalent, as is the case where ground is eliminated and both positive and negative voltage sources are utilized).

It can be stated that where intrinsic silicon is the starting substrate, application of Gate Voltages is the enabling "Spirit" that causes Field-induced first and second silicon channel region doping adjacent to chromium disilicide junctions, and causes the Single Device Equivalent to CMOS to "appear" out of the mere metallurgical "body", and remain as long as Gate Voltages are applied near (+V) or GND.

The Gate Voltage induced doping in a silicon channel region adjacent to a forward conducting Chromium Disilicide-Field Induced Doped Silicon (Schottky barrier) junction to said field induced doped silicon channel region, will invariably be highly concentrated- and the resulting (Schottky barrier) will be driven very strongly "ON" by a full (+V to GND) V), and we can set the level of (+V) to force this. Now, If this also caused high doping in the silicon channel region of the "OFF" half silicon channel region (Schottky barrier) junction, we would probably have a high leakage current reversed bias situation. This however, is not what will happen!

The semiconductor channel region in an "OFF" half of the Single Device Equivalent to CMOS, will not see a full (+V to GND) (ΔV), as the (ΔV) in the "OFF" half of the Single Device Equivalent to CMOS is with respect to Voltage supported by what is a reverse biased junction—(that is, if the Applied Gate Voltage induces carriers in the first place so as to form the (Schottky barrier) junction!). That there will be some carriers induced in the silicon channel region of the "OFF" half of the device, (which ever half that might be depending on Gate Voltage being set to +V or MID), is seemingly assured as onset of a "Pinch-Off" Region will be present in the "OFF" half silicon channel region. This is where the complexity comes into play. Three Regions of voltage drop can be relatively easily identified in the channel region of the "OFF" half of the Single Device CMOS:

1. Pinch-Off Region, near the ohmic contact to silicon channel region ΔV';
2. Ohmic Drop due to Current Flow through silicon channel region which has some conducting carriers Gate Voltage Induced therein (limited to a maximum of a resulting Reverse Biased (Schottky barrier) Junction Leakage Current which said doping in said Channel Region which is limited by effective reverse biased (Schottky barrier) junction ΔV".
3. Drop across the "OFF" Reverse biased (Schottky barrier) Junction V-ΔV.

Now, only Voltage Drops identified as present in Region 1 (ΔV') and Region 2 (ΔV") constitute a Gate Voltage effected total (ΔV) which total (ΔV) can field induce carriers to be present in an "OFF" half silicon channel region of a Single Device Equivalent to CMOS.

FIGS. 14a and 14b show two switching states for an inverting gate voltage channel induced semiconductor single device equivalent to (CMOS). In FIG. 14a the lower channel region (SC2) is "on" and "M" is at (GND) through a forward biased junction (D2) and heavily doped channel region (SC2), while the upper channel region (SC1) is "off", with two regions of voltage drop ΔV', and ΔV" described above represented. In FIG. 14b the upper channel region (SC1) is "on" and "M" is at the applied (+ or −V) through a forward biased junction (D1) and heavily doped channel region (Sell while the upper channel region (SCI), it is "off" with two regions of voltage drop ΔV', and ΔV" described above represented.

Also, note that even if no carriers are induced in an "OFF" half of a Single Device Equivalent to CMOS because the V carrier attracting voltage is too small, (see FIGS. 14a and 14b), to cause formation of a reverse biased rectifying junction in the intrinsic semiconductor, the result is an essentially non-conducting intrinsic silicon channel region adjacent to where the reverse biased junction would be formed if it did form, and current can't flow directly through an intrinsic channel region as no carriers exist therein to carry said current flow. Thus either a semiconductor channel region will be intrinsic and non-conducting or a reverse biased junction will be present in an "off" half of the single device equivalent to CMOS. This means that can be no short circuit from Source (+V) to (GND)), much as occurs in conventions CMOS where one of the seriesed N and P-Channel devices is always, (but for an extremely brief instant at switching), non-conducting.

Now, viewed as a Black-box, the Single Device CMOS output at the interconnected (non-semiconductor elements of the (Schottky barriers) rectifying junctions, will follow the forward biased (Schottky barrier) junction, so except for possible high frequency transients which might be induced therein, the redistribution of voltage drops in the identified three Regions of the "OFF" half of the Single Device CMOS silicon channel region will not be of major concern. And, as onset of Pinch-off will occur in the silicon channel region of an "OFF" half Single Device CMOS silicon channel region, we have a damping effect will ensure a (ΔV) silicon region steady state induced doping will be "predestined", (assuming we don't switch the devices faster than it takes to reach it). That is, positive feedback run-away should not be possible. Further since on Intrinsic Silicon there is not a Threshold Voltage (VT) to subtract from an applied Gate Voltage (VG), and as a result the half of the Single Device CMOS that is turning "ON" in a Gate Voltage Switching, will lead the device that is turning "OFF". This is believed as doping which must be inverted in an "OFF" half of a Single Device CMOS during a switching which will make it the "ON" half, is lower than that in the then "ON" half. This could lead to a direct short disaster were it not for the fact that the silicon in an "ON" device returns to essentially Intrinsic after the charge in a channel region that was associated with the "ON" half of the Single Device CMOS is depleted, and then is expected to go opposite doping type and form a current flow blocking reverse bias (Schottky barrier) junction in said "OFF" half). It is believed that this "ON" leading "OFF" will lead to faster operation in Single Device CMOS than is possible in Conventional CMOS. In conventional CMOS where oppositely directed Fermi-Potentials must be overcome, thereby requiring less Gate Voltage Magnitude to turn off an on P or N-Channel device, than required to turn on the accompanying N or P-Channel device. Now in the Single Device CMOS we might see some charge from an "ON" half silicon channel region, (which is turning "OFF"), be "attracted" into the silicon channel region which is turning "ON". This should be viewed while realizing that even conventional CMOS has some current drain in operation. And, with small device scaling, the charge which is available to be "attracted" will be small. It must be understood that the presently described operational scenario is very convoluted. Why this is, is best demonstrated by just diving in with examples. First, as mentioned, without applied Gate and (+V) voltages at the top ohmic junction to top silicon channel region, the devices formed in Intrinsic silicon are mere "bodies" without any animating "Spirit". Application of Gate and (+V) causes the Single Device CMOS to "appear". The full (+V) drops across the Gate of the half of the Single Device CMOS that turns on, (bottom half for Gate at (+V) and top half for Gate at GND). However, the amount of Gate Voltage which can induce carriers in the "OFF" half of the Single Device CMOS is limited as the carrier inducing portion of the applied Gate voltage is referenced to a voltage which rides "atop", (if the Gate Voltage is at +V), or "below" (if the Gate Voltage is at GND), a reverse biased (Schottky barrier) junction, (if carriers are induced to be present at all in the "OFF" half silicon channel of the Single Device CMOS). If no carriers are induced to be present in an "OFF" half silicon channel region, there will be no reversed bias (Schottky barrier) junction even formed—but the silicon channel associated therewith will be non-conducting Intrinsic. This is very desirable. Onset of Pinchoff in the "OFF" half silicon channel region, however, seemingly ensures that some applied Gate voltage will be available to induce carriers to be present in the silicon channel region of the "OFF" half of the Single Device CMOS (whichever half that is at a time—top for Gate volts=(+V) and bottom for Gate volts= GND), thus the "OFF" half of the Single Device CMOS will have a functional reverse biased (Schottky barrier) junction region present therein, along with the onset of Pinchoff Region, and a somewhat conductive silicon channel Region. How voltages will divide across said three regions will be a very complex function of time. But, if the reverse bias (Schottky barrier) junction forms, it must be appreciated that most voltage drop will probably appear across it. This could mean that if the Gate voltage is set to (+V), the Gate Voltage and the (+V) applied to the top ohmic junction to the top silicon channel could be at the same voltage and thus no Gate driving voltage will exist to induce carriers presence. (Reverse Feedback). If the reverse bias (Schottky barrier) junction is leaky though, and some carriers are present in the "OFF" half silicon channel region, some current could flow through what could become a high resistance "OFF" half silicon channel region of the Single Device CMOS, thereby leading to a voltage drop which will cause some voltage drop across the "OFF" half silicon channel region, thereby causing some, (positive feedback type), Gate Voltage silicon channel region carrier inducing influence. This will increase the carriers present in the "OFF" half silicon channel region, thus the conductance of it, and reduce the voltage drop across it effected by current flow through it, thereby reducing the Gate voltage carrier inducing effect—but current flow could increase and offset the effect. Also, more carriers in the "OFF" half silicon channel region, mean that the formed (Schottky barrier) junction will be more "leaky", thereby allowing more current to flow through the formed reverse bias (Schottky barrier) junction, but more carriers mean higher conductivity in the "OFF" half silicon channel region, so less voltage drop thereacross. It is possible that the:

"more-carriers-higher-reverse-bias-(Schottky-barrier) junction-leakage-current", and "more-carriers-less-channel-resistance and-voltage-drop-due-to-current-flow-therethrough"

effects will cancel each other to some extent, and trend to a steady state value for the amount of Gate Voltage which drops across the Gate, ($\Delta V$), and can induce carriers into an "OFF" half silicon channel region of a Single Device CMOS. The reverse bias (Schottky barrier) junction will probably drop most (+V) across it, and a smaller drop across an onsetting Pinchoff will possibly account for most the rest. The portion of (+V) which drops across the silicon channel region due to current flow therethrough (limited to a maximum of the reverse leakage of the reverse biased (Schottky barrier) junction which is formed by the presence of Gate voltage induced carriers), will probably be relatively small, and will probably not greatly effect the voltage at the reverse biased (Schottky barrier) junction against which the applied Gate Voltage plays, to form the "OFF" half silicon channel region carrier inducing effect. Various geometries and Gate Oxide depths etc. might help diminish any adverse effects, and enhance desirable ones, whatever desirable effects turn out to be upon close examination. Of course, where metallurgical doped semiconductor is utilized as a starting substrate, a similar analysis is applicable in that an "OFF" channel region is less heavily doped by field induced means than an "ON" channel region, in operation.

It is also noted that if one of the electrically non-interconnected source junctions (S) of an inverting single device equivalent to CMOS, as in FIGS. 7a and 7b, is tied to a back of the substrate contact, (as would be the case if in FIG. 13a one of the voltage sources was to be replaced with a short circuit), then the effective channel gate voltage is effectively "decoupled" from the voltage present atop the reverse biased (Schottky barrier) junction as regards its ability to cause carriers to be attracted into the first and second channel regions. Under such a biasing scheme both the first and second channel regions would be more similarly affected by applied gate voltage to the end that approximately equal numbers of carriers would be attracted into each of said first and second channel regions. This enables a simplified analysis, but perhaps less optimum operation in that the "off" channel region during a point in a switching cycle would be more highly populated with carriers, with attendant higher reverse bias (Schottky barrier) junction leakage current etc.

A similar analysis of the non-inverting single device equivalent to CMOS device is far less involved, because it is the essentially ohmic junctions which are electrically interconnected. Thus, in a FIG. 13b type bias arrangement, one of the first and second channel regions, which is "off", does not sit atop a reverse biased junction and thereby limit the applied gate to channel carrier attraction voltage, while the other, (second and first respectively), "on" channel region does not. Rather, where a FIG. 13b biasing arrangement, is applied to a non-inverting single device equivalent to CMOS device, both first and second channel regions sit atop a reverse biased (Schottky barrier) junction, and said fist and second channel regions are ohmically interconnected to one another, (and in fact can be a merged, ohmically accessed, single channel region). However, it is noted that an onset of pinch-off region will exist near the forward biased (Schottky barrier) junction which is present at the end of the channel region opposite that at which is present the reverse biased junction, and will serve to drop some voltage thereacross, thereby providing some channel region carrier attracting voltage drop from the gate to the channel region. The operation of the non-inverting single device equivalent to CMOS in a FIG. 13b biasing arrangement will thus depend on the relative impedance of the pinch-off region and the reverse bias (Schottky barrier) junction as well as the current flow therethrough. Particularly in a FIG. 13a type biasing arrangement, however, the applied gate voltage is referenced to the back of the semiconductor substrate, and will not be limited in its ability to attract carriers into the first and second channel regions by referencing to the top of a reverse biased junction which sits at essentially the applied gate voltage less a voltage drop across an onset of pinch-off region. During operation, the presence of the onset of pinch-off region near the forward biased junction forms a voltage divider with the reverse biased (Schottky barrier) junction, to the end that most voltage drops across the inherently higher impedance reverse biased junction. Reasonably assuming that the total impedance of the onset of pinch-off region plus the reverse biased junction is sufficiently high so that current flow through the non-inverting single device equivalent to CMOS is low, it is expected that said non-inverting single device equivalent to CMOS will operate well in a FIG. 13a type biasing circuit, at least as a sequentially last stage buffer in an integrated circuit environment, assuming that the voltage drop across the onset of pinch-off region is small and tolerable.

It is to be understood that while traces T1–T11 as shown in FIG. 8, and metal Gates and (SBFM) contacting metalizations as many Figures represent are typically aluminum, any functional material such as copper, polysilicon (preferably doped to provide high conductivity), and silicides can be used.

It is noted that materials which form rectifying junctions with either N or P-type doped semiconductor, are typically identified as forming "Schottky barrier junctions" with the semiconductor, and said materials are typically non-semiconductor. However, the present invention is not to be considered as limited thereto and by said terminology and semantics. Any material which forms rectifying junctions with either N or P-type semiconductor as applied in a Claimed semiconductor device, is to be considered within the scope of the present invention, regardless of how said material is applied to a semiconductor substrate.

It is emphasized that throughout this Disclosure the terms "Schottky barrier" as used to describe a junction, is to be read as a very relevant exemplary type of junction applicable to fabricating present invention semiconductor devices, rather than as a limitation thereon. Again, the present invention requires only that junction forming material(s) utilized provide rectifying characteristics when either N or P-type semiconductor is present in combination therewith, whether said N or P-type doping is metallurgical or filed induced, and regardless of how said material(s) are included with said semiconductor, (eg. by vacuum deposition, ion implantation, deposition and diffusion etc. as combined with appropriate anneals etc.).

It is also to be understood that where the terminology "gate voltage channel induced semiconductor device with operating characteristics similar to multiple device Complimentary Metal Oxide Semiconductor (CMOS) systems" and the like is utilized in this Disclosure, it is meant to indicate that only a single doping type, (eg. P or N-type or Intrinsic or P-type on Intrinsic or N-type on Intrinsic, be it metallurgical and/or field induced), must be present in a semiconductor substrate to allow realization of the "gate voltage channel induced semiconductor device". This is in contrast to the case where both N and P-type semiconductor must be present to allow realization of multiple device Complimentary Metal Oxide Semiconductor (CMOS) system which requires both N and P-channel MOSFETS be present in seriesed combination. Said terminology does not mean that a single doping type semiconductor can not have regions of opposite type doping present therein at locations therein not functionally required to that at which is present a gate voltage channel induced semiconductor device with operating characteristics similar to multiple device Complimentary Metal Oxide Semiconductor (CMOS) system.

It is also to be understood that where a junction associated with a first semiconductor channel region in a present invention device is recited as being electrically interconnected with the a junction associated with said second semiconductor channel region in a present invention device, said language is to be interpreted to be applicable, as appropriate to either integrated or component level interconnections.

Having hereby disclosed the subject matter of the present invention, it should be apparent that many modifications, substitutions, and variations of the present invention are possible in light thereof. It is to be understood that the present invention can be practiced other than as specifically described and should be limited in scope and breadth only by the appended claims.

I claim:

1. An inverting single device with operating characteristics similar to dual device seriesed N and P-Channel MOSFETS CMOS systems comprising two oppositely facing electrically interconnected rectifying diodes in semiconductor, wherein a forward direction of rectification of each of said electrically interconnected rectifying diodes changes depending upon what doping type, N or P, be it metallurgically or field induced, is present in the semiconductor, said inverting single device with operating characteristics similar to dual device seriesed N and P-Channel MOSFETS CMOS systems further comprising gate means for field inducing effective doping type in said semiconductor, said gate means being set off from said semiconductor by insulator and each of said electrically interconnected rectifying diodes having an electrically non-interconnected terminal; and wherein, in use, the electrically non-interconnected terminals of the oppositely facing rectifying diodes are held at different voltages, and a voltage between said applied different voltages, inclusive, is monitored at the electrical interconnection between said two oppositely facing rectifying diodes, which monitored voltage responds inversely to applied gate voltage, said monitored voltage being essentially electrically isolated from said gate voltage and appearing at said electrical interconnection between said two oppositely facing rectifying diodes primarily through the rectifying diode which is caused to be forward biased as a result of semiconductor doping type metallurgically present or field induced by said applied gate voltage;

the basis of operation of said inverting single device with operating characteristics similar to dual device seriesed N and P-Channel MOSFETS CMOS systems being that said two oppositely facing electrically interconnected rectifying diodes are each comprised of at least one material that forms a rectifying junction to semiconductor when it is doped either N or P-type by either metallurgical or field induced means.

2. An inverting single device as in claim 1, in which the semiconductor further comprises at least one region of parasitic current flow blocking material which prevents parasitic currents from flowing to or away therefrom through said at least one region of parasitic current flow blocking material, said at least one region of parasitic current flow blocking material being present at at least one selection from the group consisting of:

physically a part of the inverting single device comprising an extention of the electrical interconnection between the two oppositely facing electrically interconnected rectifying diodes; and physically separate from the inverting single device;

which at least one region of parasitic current flow blocking material forms rectifying junctions with both N and P-type metallurgical or field induced semiconductor.

3. An inverting single device as in claim 1, in which the semiconductor is silicon and the two oppositely facing electrically interconnected rectifying diodes comprise at least one material that forms a barrier height of approximately half the band-gap thereof with said silicon.

4. An inverting single device as in claim 1, which further comprises a voltage bias source connected across said electrically noninterconnected terminals of the oppositely facing rectifying diodes so that they are held at different voltages, each voltage being selected from the group consisting of:

+V;

−V; and

Ground.

5. An inverting single device as in claim 1, in which at least one said electrically interconnected rectifying diode comprising rectifying junction is characterized by at least one selection from the group consisting of:

being formed in a region etched into the semiconductor, being formed by a process comprising vacuum deposition of at least one material onto said semiconductor, being formed by a process comprising diffusion of at least one material into said semiconductor, being formed by a process comprising ion-implantation of at least one material into said semiconductor, and being comprised of at least one material which forms a barrier height of approximately half the band-gap of the semiconductor.

6. An inverting gate voltage channel induced semiconductor device with operating characteristics similar to multiple device Complementary Metal Oxide Semiconductor (CMOS) systems, said inverting gate voltage channel induced semiconductor device being formed in a semiconductor substrate;

said inverting gate voltage channel induced semiconductor device comprising two junctions, termed source and drain, which are separated by a first semiconductor channel region, and further comprising two additional junctions, termed source and drain, which are separated by a second semiconductor channel region, wherein gates, to which semiconductor channel region field induced doping effecting voltage can be applied, are associated with each of the first and second semiconductor channel regions, said gates being offset from said first and second semiconductor channel regions by insulating material; such that during use application a sufficient positive voltage to said gates will attract electrons to said first and second semiconductor channel regions, and such that application of sufficient negative voltage to said gates will attract holes to said first and second semiconductor channel regions, the purpose of applying such gate voltage being to affect field induced doping type of said first and second semiconductor channel regions between respective source and drain junctions, which source junctions are each essentially non-rectifying, and which drain junctions are rectifying junctions;

in which inverting gate voltage channel induced semiconductor device the rectifying drain junction associated with said first semiconductor channel region is electrically interconnected with the rectifying drain junction associated with said second semiconductor channel region, and in which said gates associated with said first and second channel regions are electrically interconnected;

such that during operation the electrically noninterconnected essentially non-rectifying source junctions are held at different voltages, and application of a gate voltage affects semiconductor channel region doping type in both said first and second channel regions by field induced means, and thus which electrically interconnected rectifying drain junction forward conducts as a result of semiconductor doping type metallurgically present or field induced by said applied gate voltage, thereby controlling the voltage present at the electrically interconnected rectifying drain junctions essentially through said forward conducting rectifying drain junction;

the basis of operation of said inverting gate voltage channel induced semiconductor device being that said rectifying drain junctions associated with said first and second semiconductor channel regions thereof are comprised of at least one material that forms a rectifying junction to a semiconductor channel region when it is doped either N or P-type by either metallurigical or field induced means.

7. An inverting gate voltage channel induced semiconductor device as in claim 6, in which the semiconductor substrate further comprises at least one region of parasitic current flow blocking material which prevents parasitic currents from flowing to or away therefrom through said at least one region of parasitic current flow blocking material, said at least one region of parasitic current flow blocking material being present at at least one selection from the group consisting of:

physically a part of the inverting gate voltage channel induced semiconductor device and comprising an extention of the electrical interconnection between the rectifying drain junction associated with said first semiconductor channel region and the rectifying drain junction associated with said second semiconductor channel region; and physically separate from the inverting gate voltage channel induced semiconductor device;

which at least one region of parasitic current flow blocking material forms rectifying junctions with both N and P-type metallurgical or field induced semiconductor.

8. An inverting gate voltage channel induced semiconductor device with operating characteristics similar to multiple device Complementary Metal Oxide Semiconductor (CMOS) systems as in claim 6, in which the semiconductor is silicon and at least one of the drain junctions comprises at least one material which forms a barrier height of approximately half the band-gap of the semiconductor with said semiconductor.

9. An inverting gate voltage channel induced semiconductor device with operating characteristics similar to multiple device Complementary Metal Oxide Semiconductor (CMOS) systems as in claim 6, which further comprises a voltage bias source connected across said electrically noninterconnected essentially non-rectifying source junctions so that they are held at different voltages, each voltage being selected from the group consisting of:

+V;
−V; and
Ground;

said voltage bias source providing a selection from the group consisting of:

having contact to the back of said semiconductor substrate; and not having contact to the back of said semiconductor substrate.

10. An inverting gate voltage channel induced semiconductor device with operating characteristics similar to multiple device Complementary Metal Oxide Semiconductor (CMOS) systems as in claim 6, in which at least one source or drain junction is characterized by at least one selection from the group consisting of:

being formed in a region etched into the semiconductor, being formed by a process comprising vacuum deposition of at least one material onto said semiconductor, being formed by a process comprising diffusion of at least one material into said semiconductor, being formed by a process comprising
ion-implantation of at least one material into said semiconductor, and
being comprised of at least one material which forms a barrier height of approximately half the band-gap of the semiconductor.

11. An inverting gate voltage channel induced semiconductor device with operating characteristics similar to multiple device Complementary Metal Oxide Semiconductor (CMOS) systems, said inverting gate voltage channel induced semiconductor device being formed in an essentially intrinsic semiconductor substrate, said inverting gate voltage channel induced semiconductor device comprising two junctions, termed source and drain, which are separated by a first semiconductor channel region, and further comprising two additional junctions, termed source and drain, which are separated by a second semiconductor channel region, wherein gates, to which semiconductor channel region effecting voltage can be applied, are associated with each of the first and second semiconductor channel regions, said gates being offset from said first and second semiconductor channel regions by insulating material;

such that during use application of a sufficient positive voltage to said gates will attract electrons to said first and second semiconductor channel regions, and such that application of sufficient negative voltage to said gates will attract holes to said first and second semiconductor channel regions, the purpose of applying such gate voltage being to affect field induced doping of said first and second semiconductor channel regions between respective source and drain junctions, which source junctions are each essentially non-rectifying when sufficient field induced doping is present in the channel region adjacent thereto, and which drain junctions are each rectifying when sufficient field induced doping is present in the channel region adjacent thereto;

in which inverting gate voltage channel induced semiconductor device the drain junction associated with said first semiconductor channel region is electrically interconnected with the drain junction associated with said second semiconductor channel region, and in which said gates associated with said first and second channel regions are electrically interconnected;

such that during operation the electrically noninterconnected source junctions are held at different voltages, and application of a gate voltage affects semiconductor channel region doping in said first and second channel regions by field induced means, and thus which electrically interconnected rectifying drain junction in said semiconductor substrate forms, as a result of semiconductor doping type field induced by said applied gate voltage, and forward conducts, thereby controlling the voltage present at the electrically interconnected drain junctions essentially through said formed forward conducting rectifying drain junction;

the basis of operation being that the drain junctions associated with said first and second semiconductor channel regions are comprised of at least one material that forms a rectifying junction to a semiconductor channel region when it is caused to be doped either N or P-type by field induced means.

12. An inverted gate voltage channel induced semiconductor device as in claim 11, in which the semiconductor substrate further comprises at least one region of parasitic current flow blocking material which prevents parasitic currents from flowing to or away therefrom through said at least one region of parasitic current flow blocking material, said at least one region of parasitic current flow blocking material being present at at least one selection from the group consisting of:

physically a part of the inverting gate voltage channel induced semiconductor device and comprising an extention of the electrical interconnection between the rectifying drain junction associated with said first semiconductor channel region and the rectifying drain junction associated with said second semiconductor channel region; and physically separate from the inverting gate voltage channel induced semiconductor device;

which at least one region of parasitic current flow blocking material forms rectifying junctions with both N and P-type metallurgical or field induced semiconductor.

13. An inverting gate voltage channel induced semiconductor device in claim 11 in which the semiconductor substrate channel region and, when formed, adjacent drain junction which is not forward conducting, is characterized by at least one selection from the group consisting of:

a. being an essentially intrinsic channel region;

b. being functionally comprised of two regions across which voltage can drop, namely an onset of pinch-off region and an essentially intrinsic channel region;

c. being functionally comprised of three regions across which voltage can drop, namely an onset of pinch-off region, a portion of the channel region which is populated with some gate voltage field induced carriers, and a formed reverse biased rectifying junction.

14. An inverting gate voltage channel induced semiconductor device as in claim 11, in which the semiconductor substrate channel region and adjacent formed rectifying drain junction which is forward conducting is characterized as comprising a field induced carrier containing channel region and a forward biased rectifying junction.

15. An inverting gate voltage channel induced semiconductor device with operating characteristics similar to multiple device Complementary Metal Oxide Semiconductor (CMOS) systems as in claim 11, in which the semiconductor is silicon and at least one of the drain junctions comprises at least one material which forms a barrier height of approximately half the band-gap of the semiconductor with said semiconductor.

16. An inverting gate voltage channel induced semiconductor device with operating characteristics similar to multiple device Complementary Metal Oxide Semiconductor (CMOS) systems as in claim 11, which further comprises a voltage bias source connected across said electrically non-interconnected essentially non-rectifying source junctions so that they are held at different voltages, each voltage being selected from the group consisting of:

+V;

−V; and

Ground;

said voltage bias source providing a selection from the group consisting of:

having contact to the back of said semiconductor substrate; and not having contact to the back of said semiconductor substrate.

17. An inverting gate voltage channel induced semiconductor device with operating characteristics similar to multiple device Complementary Metal Oxide Semiconductor (CMOS) systems as in claim 11, in which at least one source or drain junction is characterized by at least one selection from the group consisting of:

being formed in a region etched into the semiconductor, being formed by a process comprising vacuum deposition of at least one material onto said semiconductor, being formed by a process comprising diffusion of at least one material into said semiconductor, being formed by a process comprising ion-implantation of at least one material into said semiconductor, and being comprised of at least one material which forms a barrier height of approximately half the band-gap of the semiconductor.

* * * * *